US011018689B2

(12) United States Patent
Mohajer et al.

(10) Patent No.: US 11,018,689 B2
(45) Date of Patent: May 25, 2021

(54) PARALLEL COMPUTING USING STOCHASTIC CIRCUITS AND DETERMINISTIC SHUFFLING NETWORKS

(71) Applicant: Regents of the University of Minnesota, Minneapolis, MN (US)

(72) Inventors: Soheil Mohajer, Plymouth, MN (US); Zhiheng Wang, St Paul, MN (US); Kiarash Bazargan, Plymouth, MN (US); Marcus Riedel, Shorewood, MN (US); David J. Lilja, Maplewood, MN (US); Sayed Abdolrasoul Faraji, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 231 days.

(21) Appl. No.: 16/165,713

(22) Filed: Oct. 19, 2018

(65) Prior Publication Data
US 2019/0121839 A1      Apr. 25, 2019

Related U.S. Application Data

(60) Provisional application No. 62/574,503, filed on Oct. 19, 2017.

(51) Int. Cl.
  *G06F 7/70*  (2006.01)
  *H03M 7/26*  (2006.01)
(52) U.S. Cl.
  CPC .............. *H03M 7/26* (2013.01); *G06F 7/70* (2013.01)

(58) Field of Classification Search
  CPC ............ G06F 7/70; G06N 3/0472; H03M 7/26
  See application file for complete search history.

(56) References Cited

U.S. PATENT DOCUMENTS

| | | | |
|---|---|---|---|
| 7,868,806 B2 | 1/2011 | Seo et al. | |
| 10,063,255 B2 | 8/2018 | Riedel et al. | |
| 10,437,561 B2* | 10/2019 | Droulez | G06F 7/584 |
| 2017/0255225 A1 | 9/2017 | Lilja et al. | |
| 2018/0196642 A1 | 7/2018 | Droulez et al. | |

FOREIGN PATENT DOCUMENTS

| | | |
|---|---|---|
| GB | 1184652 | 3/1970 |
| WO | 2017/001212 A1 | 1/2017 |

OTHER PUBLICATIONS

V. Sehwag, N. Prasad and I. Chakrabarti, "A parallel stochastic number generator with bit permutation networks", IEEE Transactions on Circuits and Systems II: Express Briefs, 2017 (Year: 2017).*

(Continued)

*Primary Examiner* — Matthew D Sandifer
(74) *Attorney, Agent, or Firm* — Shumaker & Sieffert, P.A.

(57) ABSTRACT

In some examples, a device includes shuffling circuitry configured to receive an input unary bit stream and generate a shuffled bit stream by selecting n-tuple combinations of bits of the input unary bit stream. The device also includes stochastic logic circuitry having a plurality of stochastic computational units configured to perform operations on the shuffled bit stream in parallel to produce an output unary bit stream, each of the stochastic computational units operating on a different one of the n-tuple combinations of the bits.

20 Claims, 21 Drawing Sheets

(56) References Cited

OTHER PUBLICATIONS

Alaghi et al., "Survey of Stochastic Computing," ACM Transactions on Embedded Computing Systems, vol. 12, May 2013, 19 pp.
Brown et al., "Stochastic Neural Computation I: Computational Elements," IEEE Transactions on Computers, vol. 50, No. 9, Sep. 2001, 15 pp.
Demaeyer et al., "Noise-induced Escape from Bifurcating Attractors: Symplectic Approach in the Weak-noise Limit," Physical Review E, vol. 80, No. 3, Aug. 2009, 16 pp.
Faraji et al., "Hybrid Binary-Unary Hardware Accelerator," ASPDAC '19 Proceedings of the 24th Asia and South Pacific Design Automation Conference, Jan. 2019, 6 pp.
Gaines, "Stochastic Computing Systems," Advances in Information Systems Science, vol. 2, Chapter 2, 1969, 69 pp. (Applicant points out, in accordance with MPEP 609.04(a), that the year of publication, 1956, is sufficiently earlier than the effective U.S. filing date, so that the particular month of publication is not in issue.).
Hamm et al., "Quasipotentials for Simple Noisy Maps with Complicated Dynamics," Journal of Statistical Physics, vol. 66, No. 3, Feb. 1992, pp. 689-725 37 pp.
Jaworski, "Verilog HDL Model based Thermometer-to-binary Encoder with Bubble Error Correction," 2016 MIXDES—23rd International Conference Mixed Design of Integrated Circuits and Systems, Jun. 2016, 6 pp.
Jenson et al., "A Deterministic Approach to Stochastic Computation," 2016 IEEE/ACM International Conference on Computer-Aided Design (ICCAD), Nov. 2016, 8 pp.
Kim et al., "An Energy-efficient Random Number Generator for Stochastic Circuits," 2016 21st Asia and South Pacific Design Automation Conference (ASP-DAC), Jan. 2016, 6 pp.
Li et al., "A Stochastic Reconfigurable Architecture for Fault-Tolerant Computation with Sequential Logic," 2012 IEEE 30th International Conference on Computer Design (ICCD), Sep. 2012, 6 pp.
Li et al., "Logical Computation on Stochastic Bit Streams with Linear Finite State Machines," IEEE Transactions on Computers, vol. 63, No. 6, Jun. 2014, 14 pp.
Li et al., "A Reconfigurable Stochastic Architecture for Highly Reliable Computing," GLSVLSI '09 Proceedings of the 19th ACM Great Lakes Symposium on VLSI, May 2009, 6 pp.
McNeill et al., "Dynamic Range and Error Tolerance of Stochastic Neural Rate Codes," Neurocomputing, vol. 48, Oct. 2002, 13 pp.

Mohajer et al., "Routing Magic: Performing Computations Using Routing Networks and Voting Logic on Unary Encoded Data," Proceedings of ACM/SIGDA International Symposium on Field-Programmable Gate Arrays (FPGS'18) Feb. 2018, 10 pp.
Najafi et al., "A Reconfigurable Architecture with Sequential Logic-based Stochastic Computing," ACM Journal on Emerging Technologies in Computing Systems (JETC) vol. 13, No. 4, Aug. 2017, 28 pp.
Qian et al., "An Architecture for Fault-tolerant Computation with Stochastic Logic," IEEE Transactions on Computers, vol. 60 No. 1, Jan. 2011, 13 pp.
Qian et al., "The Synthesis of Robust Polynomial Arithmetic with Stochastic Logic," 2008 45th ACM/IEEE Design Automation Conference, Jun. 2008, 6 pp.
Qian et al., "The Synthesis of Stochastic Circuits for Nanoscale Computation," International Journal of Nanotechnology and Molecular Computation, vol. 1, No. 4, Oct. 2009, 19 pp.
Qian et al., "Uniform Approximation and Bernstein Polynomials with Coefficients in the Unit Interval," European Journal of Combinatorics, vol. 32, No. 3, Apr. 2011, 16 pp.
Salehi et al., "Computing Polynomials with Positive Coefficients using Stochastic Logic by Double-NAND Expansion," Proceedings of the on Great Lakes Symposium on VLSI, May 2017, 4 pp.
Sehwag et al., "A Parallel Stochastic Number Generator with Bit Permutation Networks," IEEE Transactions on Circuits and Systems II: Express Briefs, vol. 65, No. 2, Feb. 2018, 5 pp.
Von Neumann, "Probabilistic Logics and the Synthesis of Reliable Organism from Unreliable Components," Automata Studies, 1956, 56 pp. (Applicant points out, in accordance with MPEP 609.04(a), that the year of publication, 1956, is sufficiently earlier than the effective U.S. filing date, so that the particular month of publication is not in issue.).
Wang et al., "Randomness Meets Feedback: Stochastic Implementation of Logistic Map Dynamical System," 2015 52nd ACM/EDA/IEEE Design Automation Conference (DAC), Jun. 2015, 7 pp.
Wang et al., "Stochastic Implementation and Analysis of Dynamical Systems Similar to the Logistic Map," IEEE Transactions on Very Large Scale Integration (VLSI) Systems, vol. 25, No. 2, Feb. 2017, 15 pp.
Yuan et al., "A Throughput-agnostic 11.9-13.6GOPS/mW Multi-Signal Classification SoC for Cognitive Radios in 40nm CMOS," 2015 Symposium on VLSI Circuits, Jun. 2015, 2 pp.
Zhu et al., "Binary Stochastic Implementation of Digital Logic," FPGA '14 Proceedings of the 2014 ACM/SIGDA International Symposium on Field-Programmable Gate Arrays, Feb. 2014, 9 pp.

* cited by examiner

TWO-DIMENSIONAL MATRIX

FIG. 3A

AND OPERATION

FIG. 3B

XOR OPERATION

FIG. 3C d-DIMENSIONAL CUBE m-TH LAYER

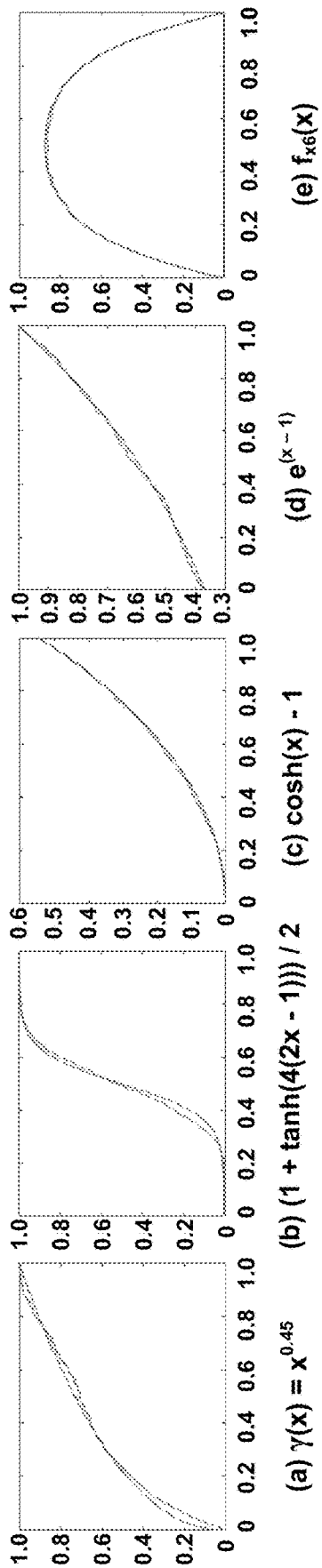
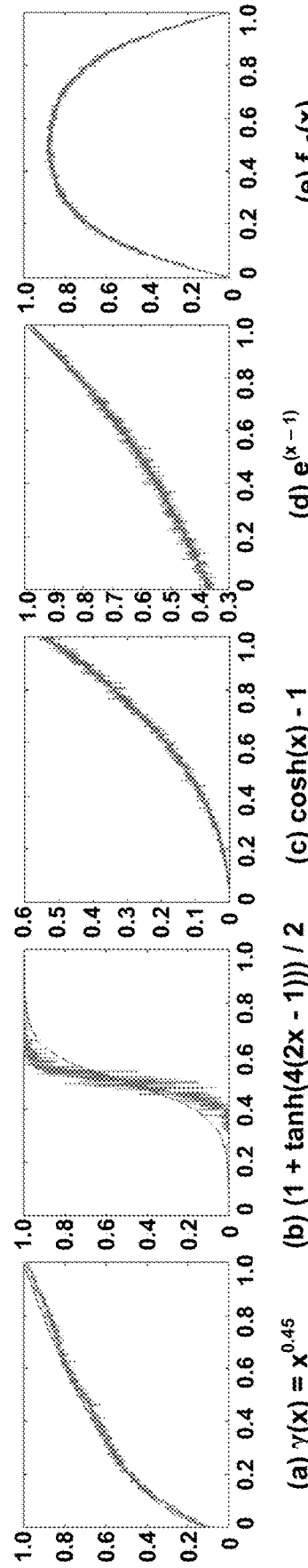
FIG. 9A (a) γ(x) = x^{0.45}
FIG. 9B (a) γ(x) = x^{0.45}
FIG. 9C (b) (1 + tanh(4(2x − 1))) / 2
FIG. 9D (b) (1 + tanh(4(2x − 1))) / 2
FIG. 9E (c) cosh(x) − 1
FIG. 9F (c) cosh(x) − 1
FIG. 9G (d) $e^{(x-1)}$
FIG. 9H (d) $e^{(x-1)}$
FIG. 9I (e) $f_{x6}(x)$
FIG. 9J (e) $f_{x6}(x)$

TABLE VI

FIG. 17

PARALLEL COMPUTING USING STOCHASTIC CIRCUITS AND DETERMINISTIC SHUFFLING NETWORKS

This application claims the benefit of U.S. Provisional Patent Application No. 62/574,503 (filed Oct. 19, 2017), the entire content being incorporated herein by reference.

GOVERNMENT INTEREST

This invention was made with government support under CCF-1408123 awarded by National Science Foundation. The government has certain rights in the invention.

TECHNICAL FIELD

The invention relates to electronic circuits and, in particular, performing arithmetic operations in electronic circuits.

BACKGROUND

In the paradigm of stochastic computation, digital logic may be used to perform computation on random bit streams, where numbers are represented by the probability of observing a one. A benefit of such a stochastic representation may be that complex operations can be performed with very simple logic. For instance, multiplication may be performed with a single AND gate and scaled addition can be performed with a single multiplexer unit. One drawback may be that the computation has very high latency, due to the length of the bit streams. Another drawback may be that the computation suffers from errors due to random fluctuations and correlations between the streams. These effects may worsen as the circuit depth and the number of inputs increase.

A certain degree of accuracy may be maintained by re-randomizing bit streams, but this is an additional expense. While the logic to perform the computation is simple, generating random or pseudorandom bit streams is costly. The random or pseudorandom sources required to generate the representation are costly, consuming a majority of the circuit area (and diminishing the overall gains in area). For example, pseudorandom constructs such as linear feedback shift registers may account for as much as ninety percent of the area of stochastic circuit designs. This design may significantly diminish the area benefits.

SUMMARY

In general, techniques are described for low-latency parallel computation using stochastic computational logic. The techniques enable computation on a parallel unary stream, for example, using parallel stochastic computational logic. As described herein, rather than relying on randomness as an essential requirement for stochastic logic input, deterministic shuffling and sub-sampling techniques are described for generating inputs to the core stochastic logic. Various examples are described for performing parallel stochastic logic operations on shuffled bit streams.

For example, this disclosure describes various implementations in which a device, such as a circuit, of a deterministic parallel bit shuffling network that can use a simple deterministic thermometer encoding of data, which may result in zero random fluctuation and high accuracy, yet keeping the output bit stream length constant. The device may include core "stochastic" logic circuits as computation logic operable on the shuffled input streams. In some examples, stochastic logic circuits may be used that do not employ constant coefficients, making the logic circuits significantly smaller than a stochastic logic circuit that uses a significant amount of resources to generate constant coefficients.

The experimental results on feed-forward and feedback circuits show that the techniques described herein can achieve certain technical advantages, such as a significantly reduced area×delay value as compared with conventional binary circuits or conventional stochastic circuits.

BRIEF DESCRIPTION OF DRAWINGS

FIGS. 3A-3C illustrate N by N matrices with interaction of bits from two parallel bit bundles.

FIGS. 9A-9J are graphs illustrating two methods of performing operations. The top row of graphs shows the results from an example of this disclosure and the bottom row shows results from previous stochastic methods.

FIG. 17 is a table illustrating area and delay results using field-programmable gate arrays.

DETAILED DESCRIPTION

This disclosure describes techniques for performing parallel computation using stochastic logic operations. The techniques enable computation on a parallel unary stream, for example, using parallel stochastic computational logic. As described herein, rather than relying on randomness as an essential requirement for stochastic logic input, deterministic shuffling and sub-sampling techniques are described for generating inputs to the core stochastic logic.

Figure 2:
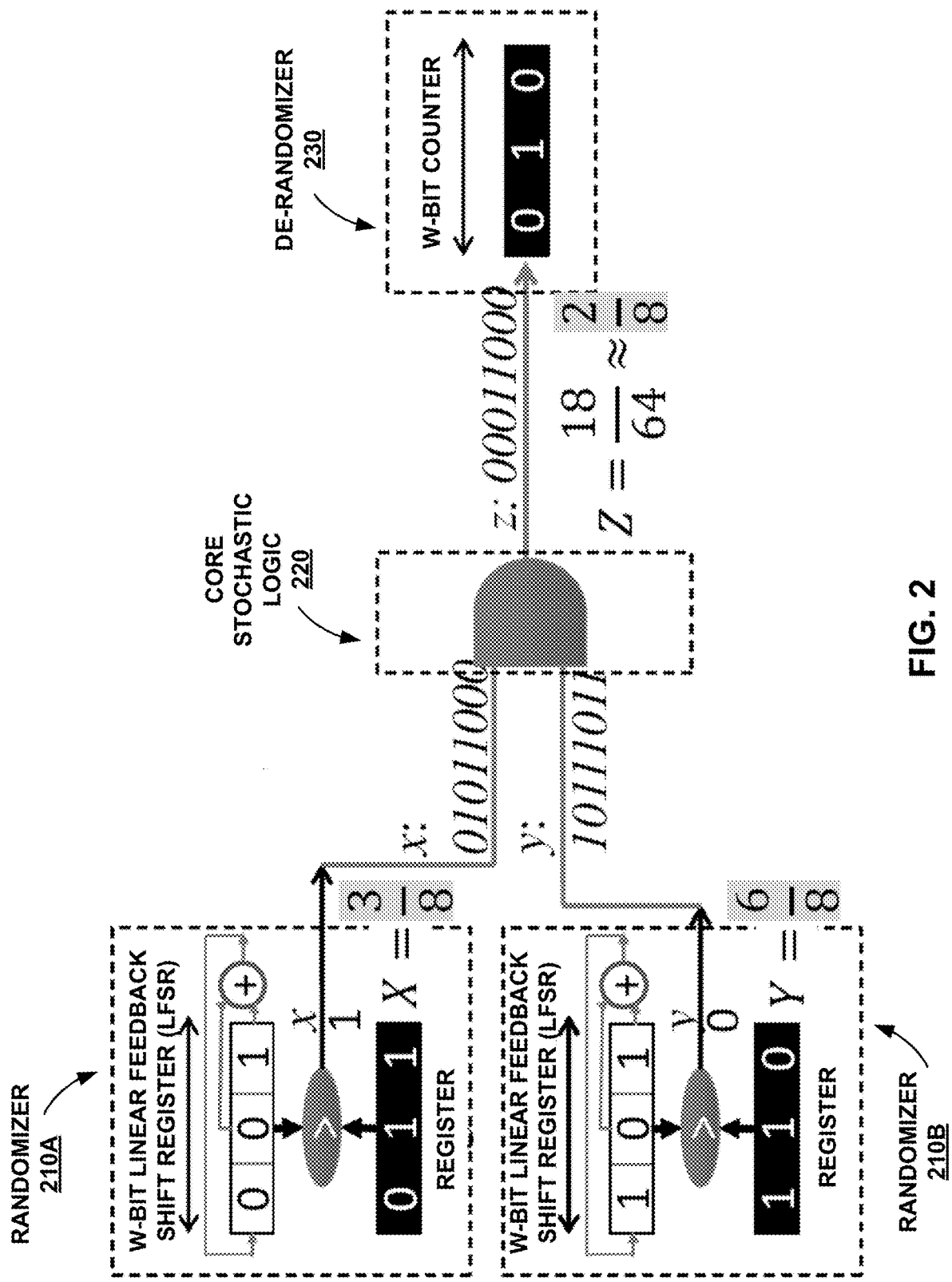
FIG. 2 is a flow diagram illustrating conventional stochastic multiplication.
Figure 4A:
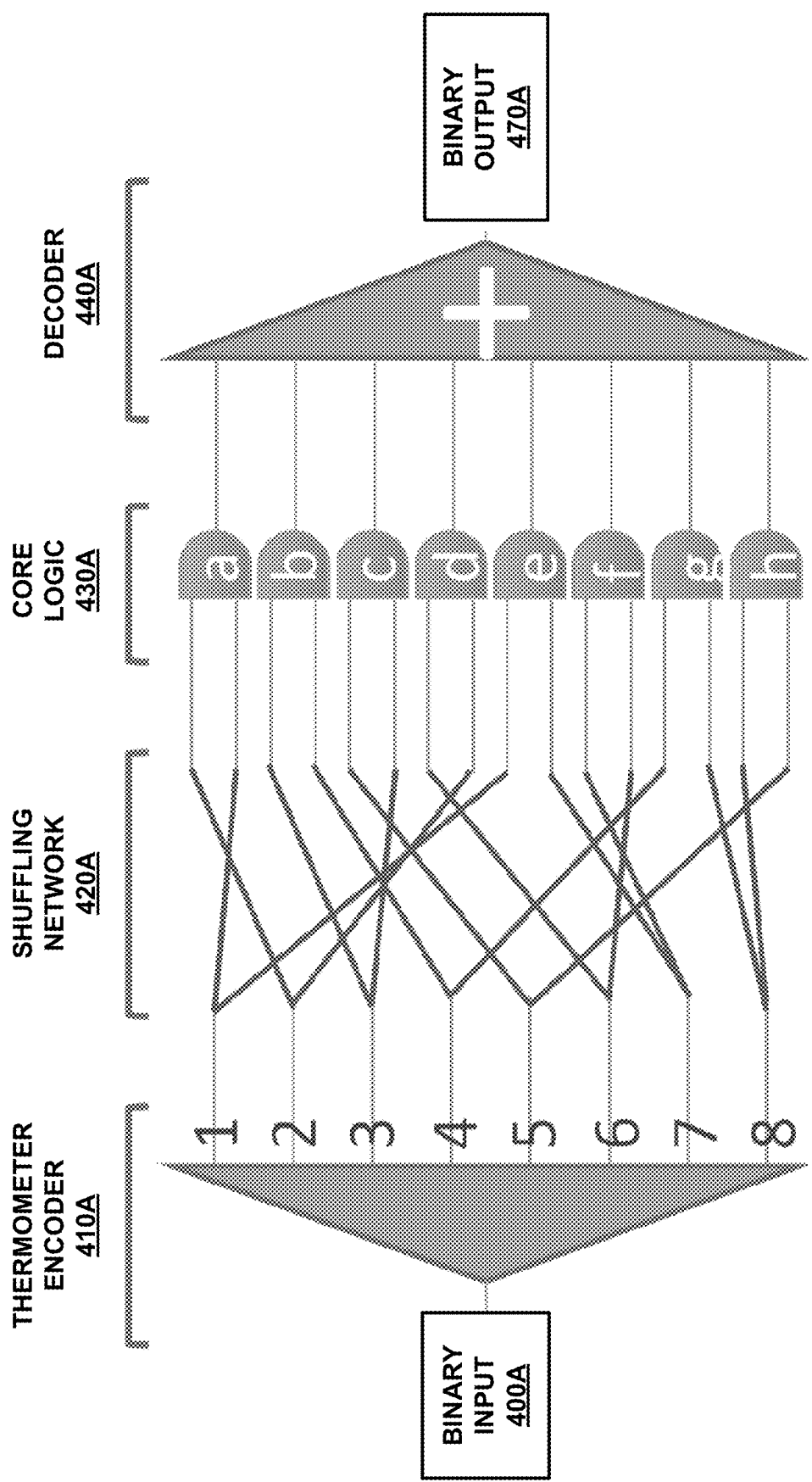
FIGS. 4A and 4B illustrate two possible architectures of a method to shuffle a bit stream and perform logic operations on the shuffled bit stream.
Figure 4B:
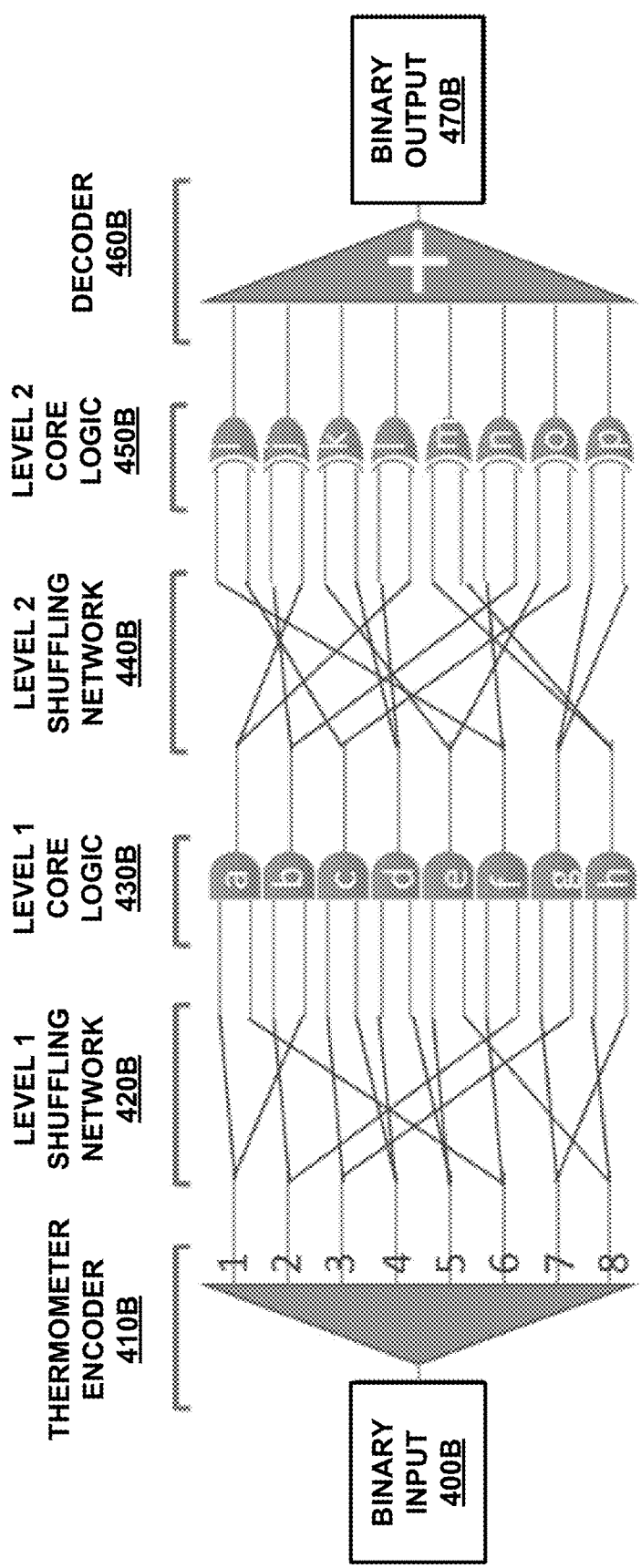

Stochastic computing may have an advantage of using small logic to perform complex computations, as compared to binary computing. However, conventional stochastic computing may also experience long latency in computation. This disclosure describes a parallel computation scheme in the context of unary stochastic and unary deterministic computing. A unary stream may be viewed as a list of zeroes and ones, with a natural number represented by the number of ones (or zeroes) in the list. A fractional number may be represented by the proportion of the ones (or zeroes) to the total length of the list (data word). The input/output to/from the "core stochastic logic" in FIG. 2 are examples of unary streams. This disclosure presents a method that enables computing a parallel unary stream, i.e., all bits are generated in a single digital clock cycle, using parallel copies of a stochastic logic, generating the output stream in one clock cycle. The parallel "stream" may be referred to herein as a "bundle" of bits. An embodiment of the parallel architecture is shown in FIGS. 4A and 4B.

The challenge with using parallel bundles to be used on stochastic logic are three-fold. First, for constant or variable inputs, it may be a challenge to generate a "random" parallel bundle in one clock cycle. Second, for variable inputs, other stochastic logic methods have relied on randomness to fulfill an essential requirement for stochastic logic input, i.e., that the input streams are not correlated. As a result, when a stochastic logic requires multiple copies of its variable input (e.g., to calculate $x^2$ from x), those copies have to be de-correlated for the logic to work. Third, for core logic, other stochastic computing methods either use many constants to implement the "computation" core of the stochastic logic or may rely on a state-machine architecture to implement them. The use of constants may result in a large number of inputs to the stochastic logic, making it hard to implement the circuit in parallel. The state-machine architecture is not trivial to parallelize due to the sequential nature of the core logic.

This disclosure describes solutions to these issues. In one example, thermometer coding may be used to generate parallel bundles, where each bundle is a representation in which all ones are stacked up-front in the bundle, followed by zeroes so as to represent the unary value. The generation of such codes is relatively cheap. Second, a hard-wired, deterministic shuffling circuit may de-correlate inputs and allow for zero errors in some cases (e.g., $x^d$) and low errors in general. Third, a direct mapping method may be configured to map functions in the real-domain to stochastic logic circuits in the {0, 1} domain while using very few, if any, constant values.

A device of this disclosure may include parallel stochastic logic circuits to perform computation with small latency. The device may also include a shuffling network to de-correlate variable inputs to the parallel stochastic logic, and sub-sample the output with low sampling errors. For example, experimental results for an example device indicated that the device may achieve an approximately seven times better performance of stochastic logic over conventional binary computations in terms of area×delay product for ten-bit resolution computations. In general, the device may be suitable when twelve or fewer bits of accuracy is needed. Compared to other stochastic computing methods, the proposed techniques may, for example, achieve eight times better area×delay at ten-bit resolution. The device may be implemented on field-programmable gate arrays (FPGA) or application-specific integrated circuits (ASIC), targeting applications such as parallel data processing, convolutional neural networks, speech processing, sensors, and full-custom digital chips operating in domains such as image processing and signal processing in general. The device may be configured to approximate computing applications and applications that tolerate some degree of uncertainty, such as video processing, image tagging.

In general, stochastic computing is a digital computation approach that operates on streams of random bits that represent probability values. In a bit stream representing probability x, each bit has probability x of being a digital value of one, as opposed to a digital value of zero. Stochastic computing can perform complex tasks with much smaller hardware footprints compared to conventional binary methods: e.g., a simple AND gate can perform multiplication between two uncorrelated bit streams. Other methods on stochastic computing circuits may rely on randomness in the input bit streams or performing full convolution of deterministic streams to achieve exact computation results. The first method may introduce high random fluctuations and hence high variability in the results. The second method results in exponential increase in the length of the bit stream as circuit depth increases. Both of these methods may suffer from very long latencies and neither method is readily adaptable for parallel implementations.

Further example details of logic devices for performing arithmetic operations on bit steams can be found in U.S. patent application Ser. No. 15/448,997, filed Mar. 3, 2017 and entitled "Polysynchronous Stochastic Circuits;" and U.S. patent application Ser. No. 15/618,530, filed Jun. 9, 2017 and entitled "Stochastic Computation Using Deterministic Bit Streams," each of which is incorporated herein by reference in its entirety.

Stochastic computing has been defined as an alternative digital approach to real arithmetic computations in which a real value $x \in [0, 1]$ is encoded as a Bernoulli sequence of length L, where the probability of a bit in the stream to be at logic one equals x. The expected value of the stream is $$\frac{N}{L} = x,$$

N being the number of ones in the stream. Stochastic computing may provide significant benefits including remarkable hardware cost reductions and high degrees of fault tolerance.

Figure 1:
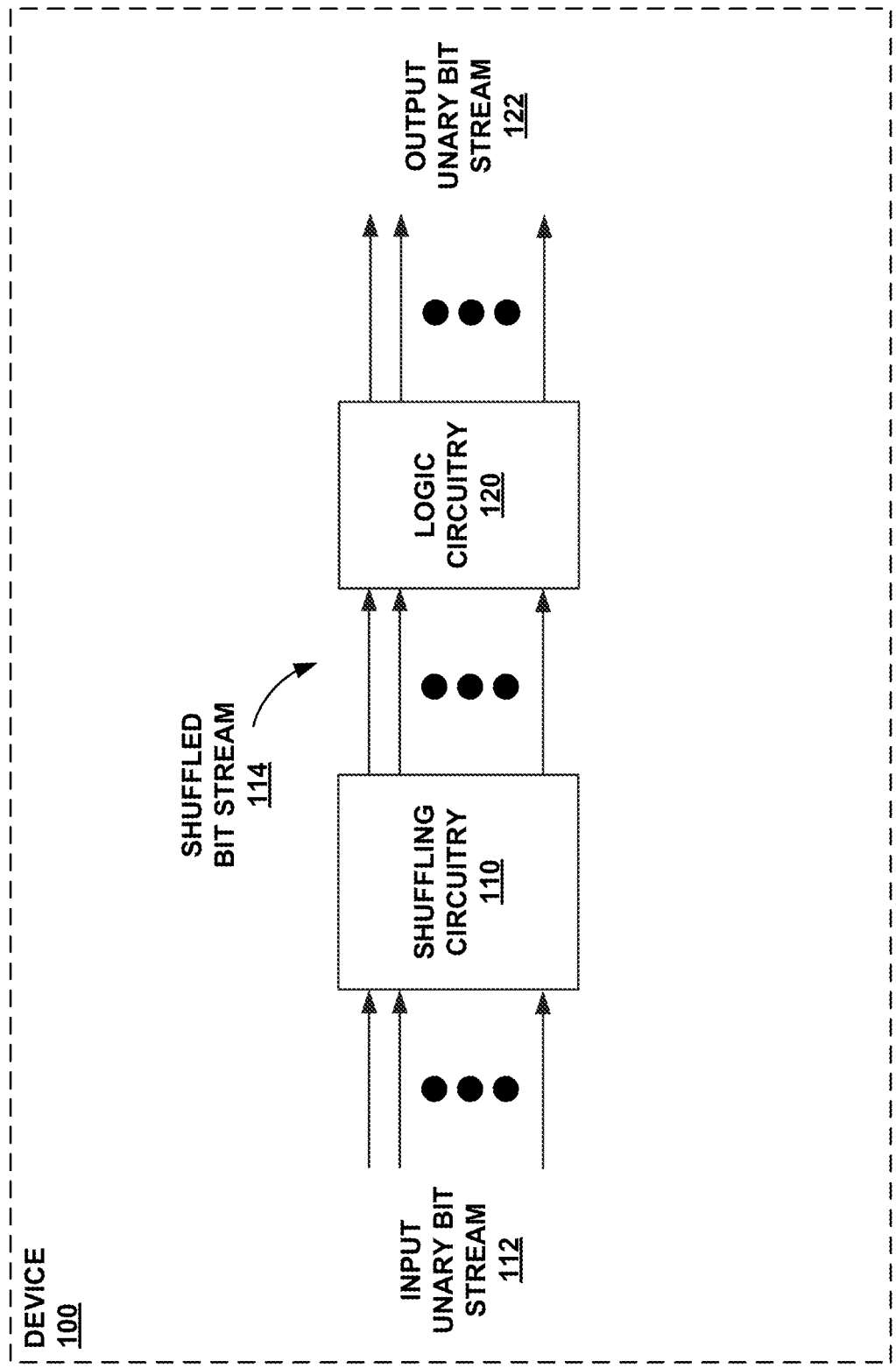
FIG. 1 illustrates a conceptual block diagram of a device configured to shuffle a bit stream and perform logic operations on the shuffled bit stream, in accordance with some examples of this disclosure.

FIG. 1 illustrates a conceptual block diagram of a device 100 configured to perform parallel stochastic computations in accordance with some examples of this disclosure. Device 100 may include an integrated circuit, computational units, processing modules, and/or digital circuitry. In some examples, device 100 may be configured to process image data, video data, audio data, and/or any signal data.

In this example of FIG. 1, device 100 includes shuffling circuitry 110 configured to shuffle and sub-sample the data bits of input unary bit stream 112 and to deliver shuffled bit stream 114 to logic circuitry 120. Input unary bit stream 112 may be a thermometer coded representation of an input binary number or an analog voltage signal received by device 100, where the input number may have a resolution of W bits of binary. As a thermometer coded number, input unary bit stream 112 may have a length of $2^W$ bits. The bits of input unary bit stream 112 may represent a numerical value by the proportion of bits that have a logic value of one.

In general, bit streams 112, 114, and 122 use a set of zeroes and ones to express a fractional number between zero and one. For examples, a bit stream carrying a ten-bit sequence of 1,1,1,0,0,0,0,0,0,0 may represent the value three-tenths because thirty percent of the bits are one. The percentage of ones and zeroes may be one form of unary encoding to represent the numerical value thirty percent or three tenths because the probability that any data bit of the bit stream is high may be equal to the numerical value. Thus, for any set of N bits, the probability that any bit in the set of bits is one corresponds to the value represented by that set of bits in the unary bit stream.

In this manner, bit streams 112, 114, and 122 are similar to bit streams used in stochastic processing circuits in that numerical data values are represented by a probability that any bit in the respective set of data bits is high. However, as described herein, unlike bit streams for conventional stochastic processing circuits in which individual bit values are random or pseudo-randomly generated, bit streams 112, 114, and 122 are generated using a unary encoding scheme. Unlike previous stochastic work, instead of transmitting the data in a bit stream serially in time, bit streams 112, 114, and 122 transmit data in one clock cycle as a bundle of bits, representing the value in space. Furthermore, techniques are described herein by which bit stream 114 is processed by stochastic logic circuitry 120 so that each of the computational units within the stochastic logic circuitry may nevertheless apply stochastic operations on the bit streams even though bit stream 114 is not random or pseudo random in nature, which would otherwise be a requirement for stochastic computational circuits to function correctly.

As further described herein, shuffling circuitry 110 may be configured to shuffle the bits of input unary bit stream 112 by sampling, scrambling, and/or mixing the bits of input unary bit stream 112. In one example, as described herein, for an n-bit unary input stream 112, shuffling circuitry 100 may be configured to operate to select different pair-wise combinations of bits of the input stream 112 to produce a sub-sampled bit stream 114. For example, shuffling circuit may be configured to operate according to a sweeping pattern through a matrix of n^2 bits to select n combinations of row/column pairs, where the matrix comprises n rows and n columns corresponding to the n bits of the input stream, and where the shuffling circuit is configured to select the combinations to draw exactly one combination per each row and column.

In some examples, unary bit stream 112 and shuffled bit stream 114 may not be stochastic (e.g., random or pseudo-random) in nature but may be deterministic in nature. The bit streams need not be stochastic in nature for the stochastic logic to perform computational operations. Instead, the bit streams may be deterministic and/or unary in nature. Although referred to herein as "stochastic logic circuitry," the logic circuitry may be configured to operate on any of the following bit streams: unary bit streams, edge coded bit streams, deterministic bit streams, stochastic bit streams, pseudorandom bit streams, and/or any other type of bit streams. Use of the term "stochastic logic circuitry" is meant to suggest only that the logic circuitry may be similar to circuitry configured to operate on stochastic bit streams.

For example, unary bit stream 112 can include a deterministic bit stream that deterministically encodes a numerical values based on a proportion of data bits in the deterministic bit stream that are high relative to data bits in the deterministic bit stream that are low. Shuffled bit stream 114 may also include a bit stream that encodes a numerical values based on a proportion of data bits in the bit stream that are high relative to data bits in the bit stream that are low. The stochastic logic circuitry (e.g., logic circuitry 120) can operate on the deterministic bit stream.

Unary bit stream 112 may include an edge-coded bit stream (e.g., a one-hot bit stream). An edge-coded bit stream is an alternative to thermometer coding in which the bit stream indicates the transition from ones to zeroes or vice versa. An edge-coded bit stream can have a single one bit to indicate the value represented by the bit stream. In the example of the one-cold bit stream, a single zero bit can encode the value represented by the bit stream. In examples in which a thermometer code for a unary bit stream is 00001111, an equivalent one-hot bit stream is 00010000, and an equivalent one-cold bit stream is 11101111. Shuffling circuitry 110 may be configured to generate shuffled bit stream 114 based on an edge-coded bit stream (e.g., unary bit stream 112). Shuffling circuitry 110 may determine the transition bit in the edge-coded bit stream and use the transition bit to generate the shuffled bit stream. Using edge coding in addition to, or as an alternative to, thermometer coding may provide resource savings when implementing multivariate functions.

Logic circuitry 120 represents a plurality of stochastic computational units configured to perform computational operations on shuffled bit stream 114 in parallel. Example operations include logical AND or XOR operations, which may be used to multiply fractions or compute polynomials such as $2x-2x^2$. Logic circuitry 120 can include any kind of logic gates and/or lookup table. In some examples, logic circuitry 120 is configured to perform computational operations only on a subsample of shuffled bit stream 114 as received from shuffling circuitry 100. The length of output unary bit stream 122 would be correlated with the number of logic elements in logic circuitry 120. Therefore, logic circuitry 120 may take up less space in order to generate output unary bit stream 122 with a shorter length, as compared to logic circuitry that is configured to generate longer bit streams.

In some examples, logic circuitry 120 may be designed using only integer multiples of Bernstein basis functions. Such a method allows logic circuitry 120 to not require constant unary input, hence reducing area and routing resource usage. The selection of the basis functions may be done using global optimization or genetic algorithms.

As described herein, the techniques may provide numerous technical advantaged. Device 100 may, for example, be faster and smaller, as compared to other processing devices. For example, a device that operates on binary bit streams may have longer latency when performing similar computational operations. A device that operates on traditional stochastic bit streams may take up a larger area performing similar computational operations. Therefore, device 100 may have much lower area×delay values, as compared to binary logic and traditional stochastic logic.

FIG. 2 is a flow diagram illustrating conventional stochastic multiplication. FIG. 2 shows how multiplication may be performed in stochastic computing using only a single AND gate (the middle box in the figure). Randomizers 210A and 210B (also called binary-to-stochastic converter) and de-randomizer 230 (also called stochastic-to-binary converter) are shown to the left and to the right of core stochastic logic 220 respectively. It can be seen that randomizers 210A and 210B and de-randomizer 230 offset the potentially large area savings that core stochastic logic 220 can offer.

Randomizers 210A and 210B are comprised of a random number generator, depicted as a Linear Feedback Shift Register (LFSR) in FIG. 2, a register, and a comparator. The LFSR unit of FIG. 2 generates one W-bit random number in each cycle, and the comparator compares the current LFSR value to the value stored in the register. The output of the comparator is 0 if the current random number is larger than the register value, and 1 otherwise. The bit stream is fed to core stochastic logic 220, and after no more than $2^W$ clock cycles, the output of the core logic may be a bit stream that can represent numbers at a resolution equivalent to W bits of binary. The area overhead of randomizers 210A and 210B and de-randomizer 230 in FIG. 2 can be amortized if more stochastic computations are cascaded.

Stochastic computing may provide some desired features compared to conventional binary. For example, stochastic computing may have a significantly smaller footprint area for the computation block (e.g., compare the AND gate in FIG. 2 to an eight-bit conventional multiplier in terms of the number of gates). In addition, stochastic computing may be able to handle noise much better than conventional logic. However, conventional stochastic computing may have a long latency of $2^W$ clocks cycles to generate results that have a resolution equivalent to W-bit binary numbers. Moreover, stochastic computing may also have high random fluctuations. Parallel implementation of the circuit can partially address the latency issue. The issue of random fluctuations may worsen the latency issue exponentially with increasing circuit depth. This disclosure describes a parallel implementation that may utilize optimal or near-optimal sub-sampling.

The terms "bit stream" and "parallel bit bundles" may be used interchangeably in this disclosure. Depending on the context, a bit stream might mean a sequence of bits arriving one after another in $2^W$ cycles, or a parallel bundle of $2^W$ wires delivering all bits in one cycle. Furthermore, even though the method of this disclosure may not include randomness, this disclosure still refers to the core computation logic as "a stochastic circuit," because other combinational stochastic logic can be used in the architecture described herein. In stochastic computing, if function f implements a polynomial of degree k, the function may use one core stochastic logic circuit with k digital input bits and outputs one digital bit. Each of the k input bits represent a one-bit quantization of x. The aggregate of such bits over $N=2^W$ bits would represent x in W-bit binary resolution. A function with k inputs may include k one-bit quantizations of the value x. As an example, $f(x)=x^3$ can be implemented with an AND gate with three inputs, hence k equals three.

An architecture for parallel implementation of stochastic logic is described herein that, unlike conventional approaches, may achieve significant reductions in latency. For example, latency of one or two cycles may be achieved in example implementations, as opposed to other conventional implementations that use $2^W$ cycles to output the bit stream. A comparison of area×delay results for each implementation is presented below in Table IIB. The parallel implementation may include a down sampling and bit shuffling network that delivers high-quality results while keeping the bit stream length constant.

The techniques of this disclosure need not rely on randomness within bit streams. Instead, devices described herein may be configured to utilize deterministic thermometer coding or similar techniques to represent parallel bundle of bits that represent the input value. Just like traditional stochastic computing, the value $M<2^W$ is represented using M bits of one—flushed to the top of the bundle—followed by $2^W-M$ bits of zero for an equivalent W-bit binary resolution.

The device may be configured to perform "direct" digital gate approximation of polynomial and non-polynomial real-valued functions. As an example, $f(x)=x^{0.45}$ may be approximated using seven constant coefficients to generate the Bernstein polynomial of degree six to approximate the function. The method described herein may use a degree-seven polynomial with no constant coefficients. Overall, a device of this disclosure may achieve an average of 10.6× improvement in terms of area×delay (A×D) compared to conventional binary implementations at 10-bit resolutions. The device may have 7.9× smaller A×D compared to other stochastic methods on average.

Other devices may include serial combinational stochastic logic circuits to implement polynomial approximation of functions. Sequential logic has also been used to implement a larger class of functions, which incurs extra latency for the state machine to enter steady state. Table IIB below compares the different implementations.

In some examples, a method may abandon randomness in generating bit streams and use the convolution of two bit streams to evaluate a two-input function such as an AND gate. The method amounts to using input streams of length $N=2^W$, and generating an output that has $N^2$ bits. The growth would be exponential as the circuit depth increases. However, the result of the computation would be exact, with no random fluctuations and no further quantization errors. For example, if an 8-bit number is multiplied by another 8-bit number, the method can generate the exact 16-bit result.

FIGS. 3A-3C illustrate N by N matrices with interaction of bits from two parallel bit bundles. FIGS. 3A-3C shows a conceptual parallel implementation of logic. In FIG. 3A, one parallel input stream is shown above the matrix, representing the value ⅝. The second parallel stream is shown to the left of the matrix. Region "A" of the matrix shows the output of the core stochastic logic when both inputs of the logic are 1. Regions B and C represent cases where only one of the two inputs is 1, and region D represents the case for (0,0). FIG. 3B shows the output of $N^2$ parallel AND gates, and FIG. 3C shows the output of parallel XOR gates. In some examples, a method may use only N parallel copies of the combinational logic instead of the full-convolution $N^2$ gates. The two-dimensional matrices of FIGS. 3A-3C will also be used to explain the sub-sampling method depicted in FIGS. 5A and 5B.

FIGS. 4A and 4B illustrate two possible architectures of a method to shuffle a bit stream and perform logic operations on the shuffled bit stream. The method may abandon randomness in favor of a deterministic encoding to eliminate random fluctuations. FIGS. 4A and 4B show the overall architecture of the proposed method. A W-bit binary input value M (e.g., binary input 400A or 400B) is converted to thermometer code ($2^W$ parallel bits, the first M of which are 1's, and the rest are zeros) by thermometer encoder 410A or 410B. Shuffling network 420A or 420B, designed using information theory basics, takes the parallel bits, and selects pairs to be fed to core stochastic logic 430A or 430B. The selection process ensures low sampling errors (in some cases provably optimal). The core stochastic logic 430A or 430B has k inputs (k=2 in the figure), and there are $2^W$ parallel copies of the circuit. FIG. 4B includes an additional layer of shuffling and core logic circuitry. Finally, the $2^W$ output bits are fed to an adder tree that converts the output to binary output 470A or 470B. In some examples, the binary input and/or binary output may instead be an analog voltage signal.

In some examples, shuffling network 420A and 420B may be configured to select a subset of n-tuple combinations of bits from the unary bit stream and deliver the subset to core logic 430A and 430B. For example, each computational unit of core logic 430A and 430B may be configured to receive three, four, or more bits from shuffling network 420A and 420B and perform operations on the received bits. As used here, "n-tuple combinations" may refer to a combination of n bits from the shuffled bit stream, where n may be the resolution of binary inputs 400A and 400B. A pair-wise combination may be a two-dimensional example of an n-tuple combination.

For example, x may be a left-flushed unary representation of length n for a number $x \in [0, 1]$ (i.e., all the ones appear first in the stream, followed by zeroes). In this example, $x_1 = x_2 = \ldots = x_{\lfloor nx \rfloor} = 1$, and $x_{\lfloor nx \rfloor + 1} = \ldots = x_n = 0$. A d-way function $f_b: [0, 1]^d \rightarrow [0, 1]$ may takes d copies of x and compute f(x). The function f(x) can be found as shown in Equation (1).

$$f(x) = \frac{\#\{(i_1, i_2, \ldots, i_d) \in [1:n]^d : f_b(x_{i_1}, \ldots, x_{i_d}) = 1\}}{n^d} \quad (1)$$

Equation (1) may achieve all-to-all interaction of bits of the d copies of x (full convolution). However, such a method may require $n^d$ bits to accurately represent this number in unary bases. Instead, a method may implement a quantized version of f(x) which can be represented in an n-length unary sequence. This quantization is given by Equation (2).

$$f(x) \mapsto \hat{f}(x) = \underbrace{11 \ldots 1}_{\lfloor nf(x) \rfloor} \underbrace{00 \ldots 0}_{n - \lfloor nf(x) \rfloor} \quad (2)$$

To obtain $\hat{f}(x)$, f(x) may be sub-sampled at the rate of $1/n^{d-1}$. $\hat{f}(x)$ may be an n-length sequence obtained by evaluating $f_b$ at n tuples $\{i_{1,t}, i_{2,t}, \ldots, i_{d,t}\}_{t=1}^n$, as shown in Equation (3).

$$\tilde{f}(x) = (f(x_{i_{1,1}}, \ldots, x_{i_{d,1}}), f(x_{i_{1,2}}, \ldots, x_{d,2}), \ldots, f(x_{i_{1,n}}, \ldots, x_{i_{d,n}})) \quad (3)$$

It may be desirable to find the sampling points $\{i_{1,t}, i_{2,t}, \ldots, i_{d,t}\}_{t=1}^n$ to achieve the result shown in Equation (4) for every $x \in [0, 1]$.

$$\tilde{f}(x) = \hat{f}(x) \quad (4)$$

A "cubesweeping" scheme may provide $\{i_{1,t}, i_{2,t}, \ldots, i_{d,t}\}_{t=1}^n$, and analyze its performance to show that the desired approximation holds. The cube-sweeping method may shuffle input bits and sub-sample at the same time. The examples described herein may begin with d=2 and extend the method to higher values of d.

In this example, binary input 400A may be a binary number with a fixed resolution, as described. In other example implementations, the input may be analog voltage signals, such signals output by a sensor, converted to a binary input. As described, a thermometer coding unit of the circuit may convert the binary number to a deterministic unary parallel bit stream. In some examples, the circuit may be configured to receive unary bit streams without any need to convert the unary bit stream. Then, the circuit may perform a deterministic shuffling of the bits, and the shuffled bits may feed into parallel core computation logic. The circuit may be configured to convert the parallel output bits of the computation logic into a binary number. The circuit may be configured to keep the resolution of the bit streams constant with zero random fluctuations and possibly minimum quantization errors.

Figure 5B:
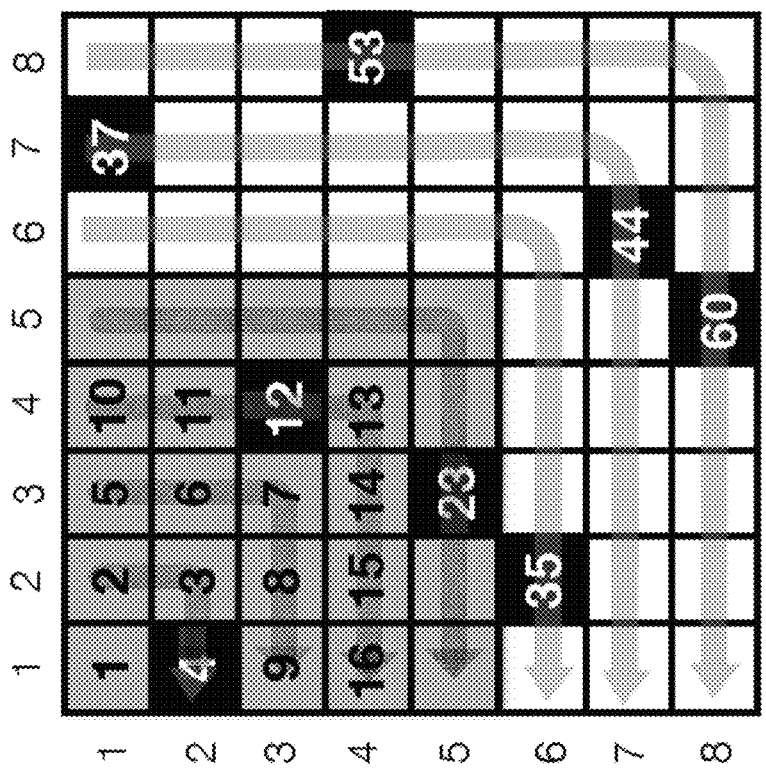
FIGS. 5A and 5B illustrate cube-sweeping sampling with adjustment of the selected set to draw exactly one element per row and column.
Figure 5A:
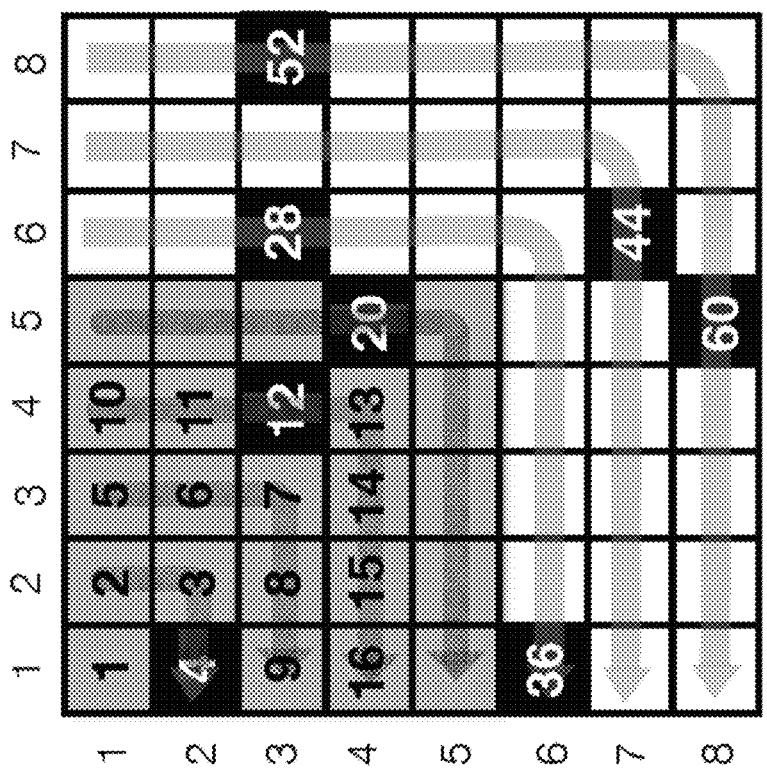

FIGS. 5A and 5B illustrate cube-sweeping sampling with adjustment of the selected set to draw exactly one element per row and column. For example, f(x) may take only two (d=2) copies of x. There are a total of $n^2$ interactions between all the bits as shown in FIGS. 3A-3C. A sweeping pattern may be configured to sub-sample the output bits on the $n^2$ bits as shown by the black cells in FIGS. 5A and 5B. FIGS. 5A and 5B show an input value x=5/8, with the gray shaded region representing the (1,1) interactions (region A in FIG. 3A). The value of x may not be known at design time, so a designer may not be able to determine how large the gray region is going to be. Assuming the output bits are one in this region, the function would represent $f(x) = x^2$ implemented as parallel AND functions. The circuit implementing f would be known at design time.

The method may include picking one bit per every n bits of the sweep in order to sub-sample. To this end, the method may first cluster the bits into n groups: $(a_1, \ldots, a_n)$, $(a_{n+1}, \ldots, a_{2n})$, etc., and then pick the middle element to decide whether the group should be mapped to zero or one. Incidentally, when the function is AND, the middle group would represent the majority of the bits in that group, hence the sub-sampling would be optimal. In practice, the sampling error may be very small for general functions.

The method explained above finds $\hat{f}(x)$ by subsampling $(a_1, a_2, \ldots, a_n^2)$. For the s-th group given by $(a_{(s-1)n+1}, a_{(s-1)n+2}, \ldots, a_{sn})$, the sampled bit is $$a_{(s-1)n + \lfloor \frac{n}{2} \rfloor},$$

and $\hat{f}(x)$ may be defined by Equation (5).

$$\hat{f}(x) = \left(a_{\lfloor \frac{n}{2} \rfloor}, a_{n + \lfloor \frac{n}{2} \rfloor}, a_{2n + \lfloor \frac{n}{2} \rfloor}, \ldots, a_{(n-1)n + \lfloor \frac{n}{2} \rfloor}\right) \quad (5)$$

For the example of FIG. 5A, the first group includes $(a_1, \ldots, a_8)$ from which $a_4$ may be sampled. Similarly, $a_{12}$ is sampled from the second group to achieve $$\hat{f}\left(\frac{5}{8}\right) = (a_4, a_{12}, a_{20}, \ldots, a_{60}).$$

In this set, some bits contribute multiple times to the output (e.g., row 3), which means the input resolution is not fully utilized for some values of n. A heuristic may reduce movements of the selected elements so that the modified set draws one and only one element from each row and column, effectively uniformly utilizing all bits in the stream.

The examples of FIGS. 4A and 4B show how to build the circuit. Remember that a resolution of $n = 2^W$ requires n parallel bits as shown in FIGS. 4A and 4B (wires numbered 1, 2, . . . , 8). To build the parallel circuit, there may be n copies of the core stochastic logic in logic circuitry 430A, 430B, or 450B (the AND gates labeled a through h in the level 1 core logic, and i through p in the level 2 core logic.) The first gate a in core logic 430A corresponds to element 4 in FIG. 5B. Similarly, gates b, c, . . . , h correspond to elements 12, 23, . . . , 60 in FIG. 5B. Element 4 is generated by letting the second bit in the bit stream (row two) interact with the first bit in the top bit stream (column one) in FIG. 4A. As a result, the two inputs of gate a have to come from wires 2 and 1, as done in FIG. 4A (note the connections to gate a). Element 60 is on row 8, column 5, so gate h derives its inputs from wires 8 and 5 in FIG. 4A. This implementation does not require multiple independent random copies of the bit stream, which may result in significant area savings.

Figures 6A, 6B:
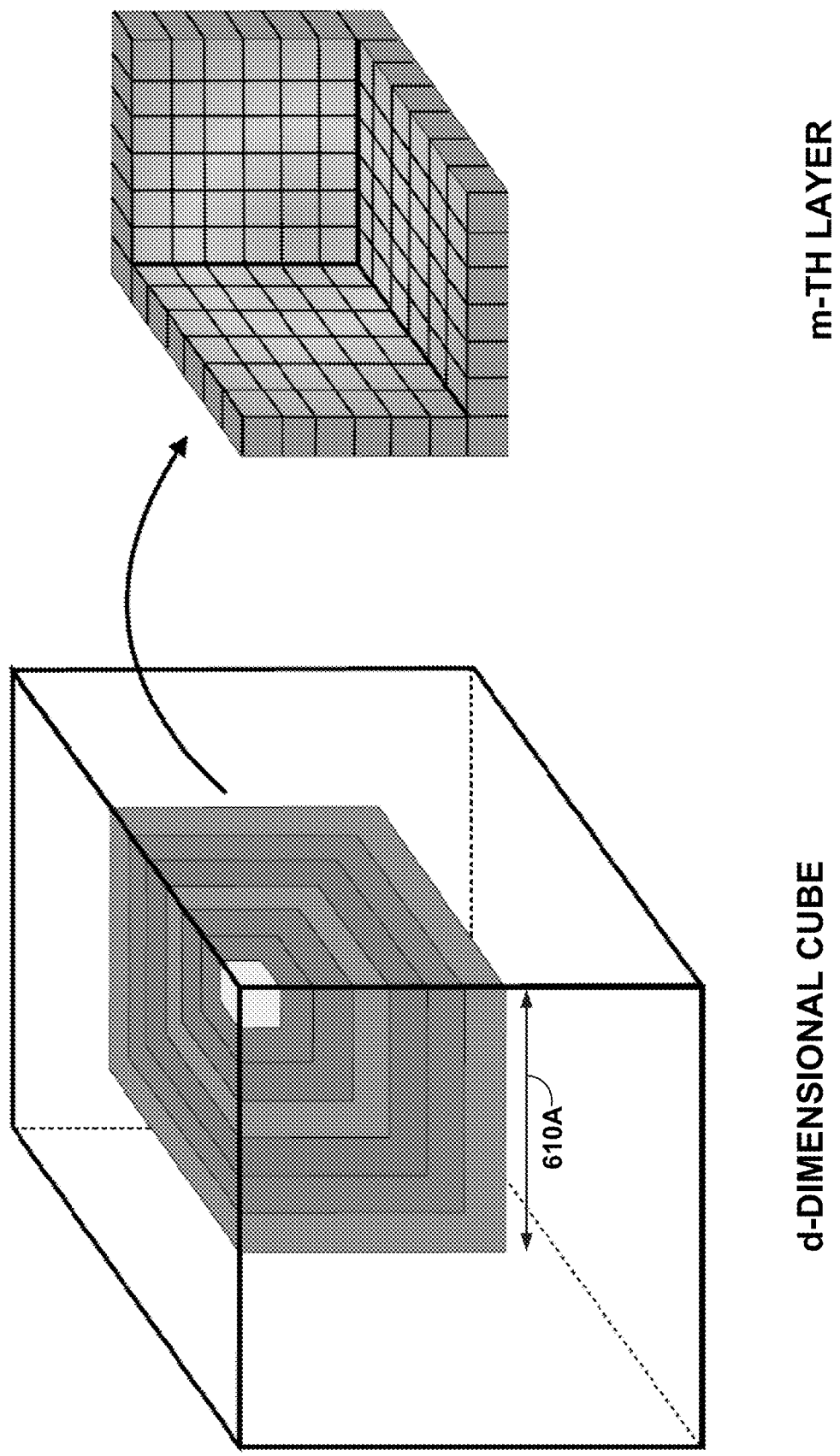
FIGS. 6A and 6B illustrate cube-sweeping ordering for a three-dimensional sub-sampling network.

FIGS. 6A and 6B illustrate cube-sweeping ordering for a three-dimensional sub-sampling network. The approach can be generalized to d-way functions f(·). Similar to the other case, a d-dimensional cube of edge length n (e.g., length 610A) may represent all possible interactions. One proposed sampling technique is based on sweeping the hypercube layer-by-layer as shown in FIGS. 6A and 6B, and sampling at the appropriate rate, which is $1/n^{d-1}$. Based on the coordinates of the sampling cells, the connection can be built with a network similar to the two-dimensional case. In the two-dimensional case, the fanout of every input bit in the bit stream was two. In the d-way function, the fanout would be d.

For example, the cube of FIG. 6A may have d dimensions, where d is equal to two, three, four, or any other integer greater than four. Each dimension may represent a separate instance of a shuffled bit stream. The d-dimensional cube may be traversed layer by layer, from the most inner layer to the most outer layer, to determine a 1-dimensional traversal path that visits every element in the d-dimensional space. The order of visiting elements in each layer can be arbitrary, in some examples. A path visiting every small 1^d cube of the N^d space, chipping away one small cube at a time, is one analogy. A computational unit may be configured to receive a bit from each dimension of the cube based on a select number of elements from the layer traversal of the d-dimensional cube, and the shuffling circuitry may be configured to select n-tuple combinations of bits to ensure that one bit from each dimension is delivered to a computational unit.

In general, the computation error of the proposed method is due to finite precision of unary representation with n d-dimensional cube m-th layer bits and due to sub-sampling from a d-dimensional cube. For a simple function, such as $f(x)=x^d$, the error due to sub-sampling may be zero, and the error analysis can be limited to the finite precision of unary representation, as explained below. For more complex functions, the error from the finite precision of unary representation may be small (see Table IIB below).

For example, the actual value of a function may be $$f(x) = \frac{A}{n^d}.$$

In a unary representation, f(x) will be quantized to $$\hat{f}(x) = \frac{m}{n},$$

where m is an integer satisfying Equation (6).

$$(m-1)n^{d-1} + \left\lfloor \frac{n^{d-1}}{2} \right\rfloor \leq A < mn^{d-1} + \left\lfloor \frac{n^{d-1}}{2} \right\rfloor \quad (6)$$

Hence, the quantization error can be bounded as shown in Equation (7).

$$|f(x) - \hat{f}(x)| = \left| \frac{A}{n^d} - \frac{m}{n} \right| = \left| \frac{A - mn^{d-1}}{n^d} \right| < \frac{\left\lfloor \frac{n^{d-1}}{2} \right\rfloor}{n^d} = \frac{1}{2n} \quad (7)$$

Among core stochastic logic synthesis methods, this disclosure will describe the global optimization or genetic algorithms approach, because unlike methods such as the Bernstein Polynomial or Maclauren series, the global or genetic optimization approach does not introduce any constant coefficients. The optimization-based approach only uses k independent bit streams representing the input value x to approximate the target function using a Boolean logic with k inputs that implements a polynomial of degree k. There are other possible combinational logic methods that use constant coefficients, but each coefficient would have increased the dimensions of the cube in the cube-sweeping algorithm.

Figure 7:
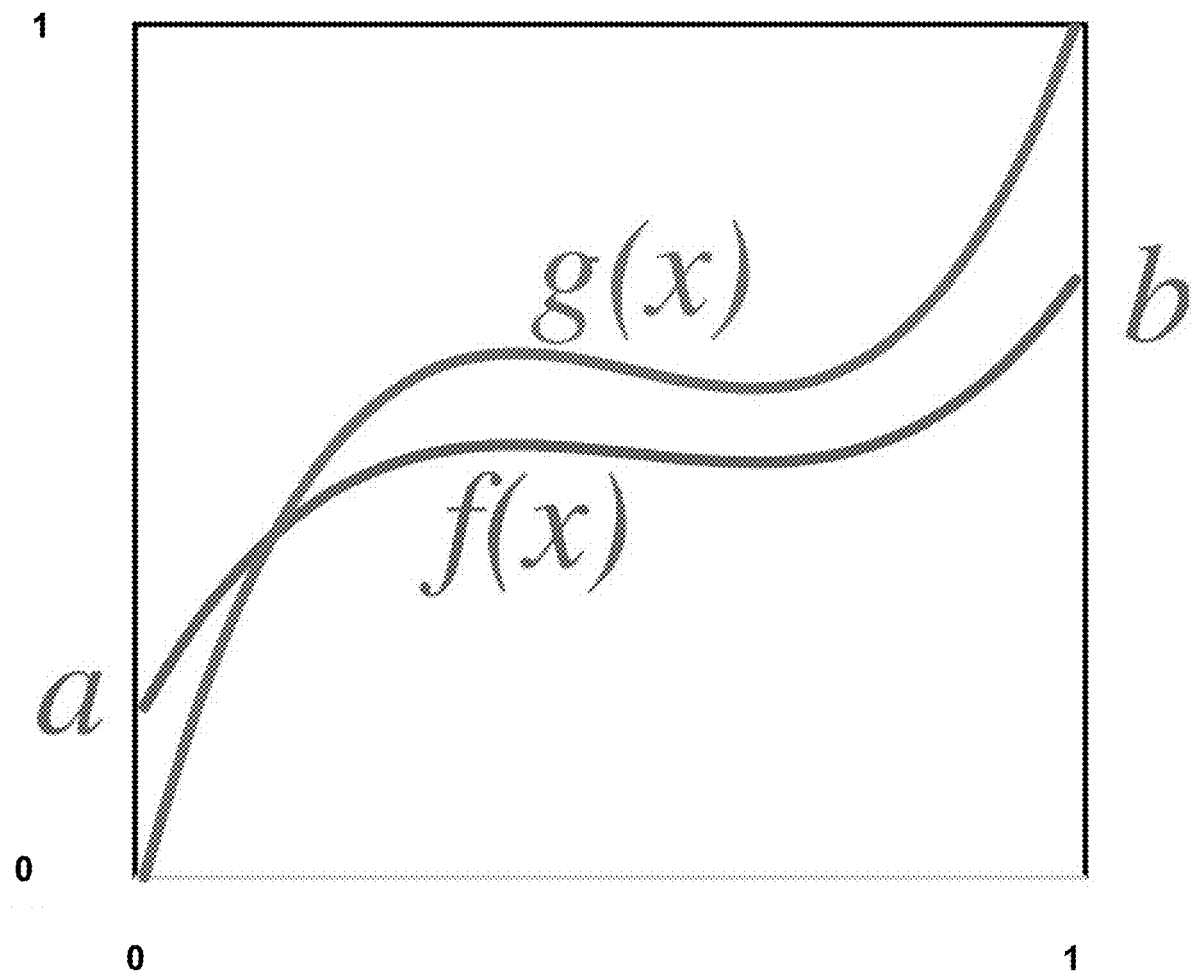
FIG. 7 is a graph illustrating the linear transformation of a function g(x) to get function f(x).

FIG. 7 is a graph illustrating the linear transformation of a function g(x) to get function f(x). The graph of FIG. 7 with functions that satisfy $f(0) \in \{0, 1\}$ and $f(1) \in \{0, 1\}$. For a function similar to f in FIG. 7, where $f(0)=a \notin \{0, 1\}$ and/or $f(1)=b \notin \{0, 1\}$. FIG. 7 uses a linear transformation $f(x)=1-\alpha(1-\beta g(x))$, where $\alpha=1-a$ and $\beta=(b-a)/(1-a)$. Then, the annealing-based curve-fitting method may be used to find g(x). The architecture of FIGS. 4A and 4B can be expanded to use constant "bit streams" that represent a and b using $2^W$ bits representing a resolution of W-bit binary, and use d+2 to generate a shuffling network, assuming that g(x) has degree d. The core logic may be expanded using a NAND gate to implement $h(x)=(1-(\beta g(x)))$, and another NAND gate to implement $f(x)=1-\alpha h(x)$. The FPGA synthesis tool will optimize away many copies of the logic (e.g., when the output is ANDed with 0).

Table I shows the Boolean logic functions that were synthesized using the above method ("iand" means an AND gate with its first input inverted). The target functions f(x) are listed in the first column. The second column approximates the function (g(x)). The third column shows how many input x values are needed, which translates to the d parameter in the cube-sweeping method. The last column shows the modifications needed to implement the target function (the issues addressed in FIG. 7). In the case of tanh, the method did not find a good approximation, so the code was modified to look for a function g(x), so that f(x)=g(g(x)). The architecture uses a parallel bit stream x, calculates y=g(x), and then uses the parallel bit stream y to calculate f(x)=g(y). All combinational logic implementing functions f(y) and g(x) can be grouped as logic circuitry 120 shown in FIG. 1 or core logic 430A shown in FIG. 4A. In the case of the tanh example, level 1 core logic 430B shown in FIG. 4B implements one copy of y=g(x), and level 2 core logic 450B shown in FIG. 4B implements the second copy of f(x)=g(y). Errors may be introduced due to the two-level implementation of the function.

TABLE I

Function approximations using linear transformations.

| Function f(x) | Circuit g(x) | deg | Post proc f(x) = |
|---|---|---|---|
| $\gamma(x) = x^{0.45}$ | inand[ixor[iand[x, x], nor[x, x]], or[xor[x, x], inv[x]]] | 7 | g(x) |
| $(1 + \tanh(4(2x - 1)))/2$ | nor[nor[nand[x, x], nor[x, x]], nand[nand[x, x], nand[x, x]]] | 8 | g(g(x)) |
| $\cosh(x) - 1$ | inor[x,inv[x]] | 2 | 0.543g(x) |
| $e^{(x-1)}$ | iand[inor[inv[x], xor[ixor[x, x], x]], x] | 5 | 1 − 0.631(1 − g(x)) |
| $f_{x6}(x)$ | or[nand[xnor[x, x], ixor[x, x]], ixnor[x, x]] | 6 | g(x) |

The function g(x) from FIG. 7 can be more efficiently approximated using basis functions of a given degree. Basis functions can be thought of as the roots to a stochastic function with a fixed degree.

Figure 8:
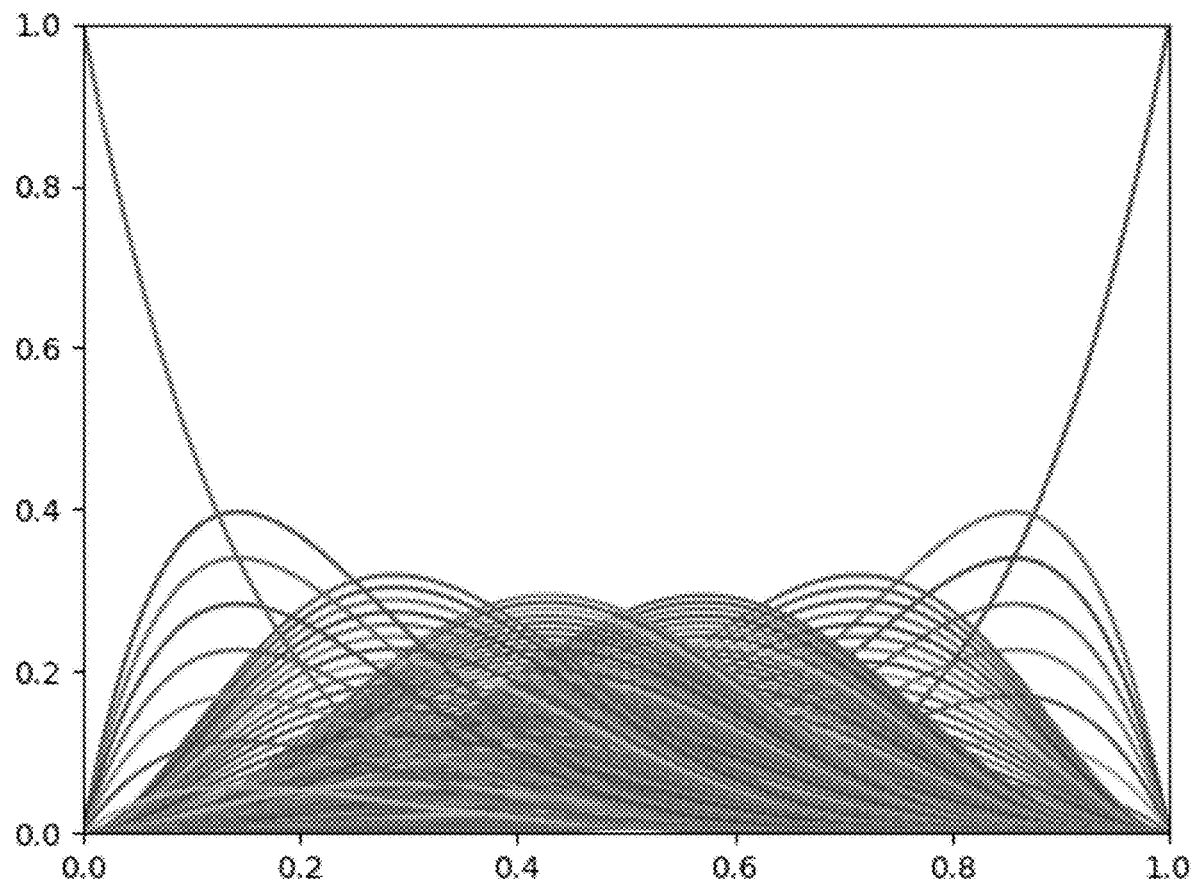
FIG. 8 is a graph of eight basis functions and their integer multiples for a degree-seven Bernstein Polynomial.

FIG. 8 is a graph of eight basis functions and their integer multiples for a degree-seven Bernstein Polynomial. Basis functions of any degree will follow a similar graphical pattern as shown in FIG. 8. There are always a basis zero, shown by the left-most decaying exponential, and a basis of the degree number, shown by the right-most exponential. Dome shaped basis function groups fill the gap in between counting from left to right.

A global optimization or genetic algorithm can be used at design time to select which basis functions and with what integer scaling factor to use to approximate a given polynomial or non-polynomial function f(x). The optimization method chooses a subset of basis functions, where the weighted sum of the basis functions makes up function g(x). The basis functions are chosen so that the sum of square errors between f(x) and g(x) over a fixed discrete set of x inputs is minimized. The integer scaling factor of basis functions is subject to the limitations of Bernstein Coefficients. The Bernstein Coefficient for basis function i of a degree d polynomial is (d choose i), as explained in the next paragraph.

Mathematically, a basis function p(x) can be represented as shown in Equation (8). where d represents the degree of the function to be approximated by the basis functions, i represents the basis number. There is a coefficient multiplier $b_i$ in which $$b \in \{x \mid x < \binom{d}{c}, x \in W\}$$

that can scale the basis function. A Bernstein polynomial is created using the (real-valued) scaled addition of the basis functions $p_i$. The scaling can be limited to integer values, obviating the need for constant coefficients when approximating functions.

$$p_i(x) = b_i(x-1)^i x^{d-i} \quad 0 \le b_i \le \binom{d}{i} \quad (8)$$

In the context of stochastic computing implementing uni-variate functions, a three-input Boolean function $f(x_1, x_2, x_3)$ would be approximating a degree-3 polynomial F(x), where $x \in \mathbb{R}$, $0 \le x \le 1$. The three stochastic inputs $x_1, x_2, x_3$ are three bits from three independent bit streams (or parallel bit bundles) feeding into the Boolean function f( ). All inputs to this function carry the same probability value representing x, but with different sequences of 1's and 0's. The probability of any of the input bits $x_1, x_2, x_3$ being 1—independent of other inputs—is x by definition of a bit stream. When searching for f( ), all Boolean functions may be bundled together in which the permutation of inputs would result in the same output. Table IIA shows the truth tables of two functions $f_1$ and $f_2$. These functions are equivalent if we swap $x_1$ and $x_3$. The probability of $(x_1, x_2, x_3)=(1, 1, 1)$ is $x^3$, which is shown in the last column of the last row of the table. In Equation (8), this polynomial is obtained when i=0, d=3, $$b_i = \binom{d}{i} = 1.$$

Similarly, the probability of $(x_1, x_2, x_3)=(1, 1, 0)$ is $x^2(1-x)$. The same real-valued basis polynomial can be implemented using two other rows (1, 0, 1) and (0, 1, 1). There are $$\binom{3}{2} = 3$$

ways of getting the polynomial $x^2(1-x)$, and the coefficient $b_i$ allows for the selection of any number of such polynomials. The different $b_i$ coefficients of a basis function $p_i($ )show the "domes" with aligned peaks in FIG. 8.

TABLE IIA

Tow Boolean functions that are equivalent if we allow input permutations.

| x1 | x2 | x3 | f1 | f2 | basis polynomial $(x-1)^i x^{d-i}$ |
|---|---|---|---|---|---|
| 0 | 0 | 0 | 0 | 0 | $(1-x)^3$ |
| 0 | 0 | 1 | 0 | 0 | $x(1-x)^2$ |
| 0 | 1 | 0 | 0 | 0 | $x(1-x)^2$ |
| 0 | 1 | 1 | 0 | 1 | $x^2(1-x)$ |
| 1 | 0 | 0 | 0 | 0 | $x(1-x)^2$ |
| 1 | 0 | 1 | 0 | 0 | $x^2(1-x)$ |
| 1 | 1 | 0 | 1 | 1 | $x^2(1-x)$ |
| 1 | 1 | 1 | 1 | 1 | $x^3$ |

As shown in Table IIA, the basis functions that compose a function relate directly to that function's truth table. For a given degree, each basis function corresponds to a set of input combinations (e.g., rows in Table IIA) that will generate the desired basis polynomial $(x-1)^i x^{d-i}$. The basis function number, i from Equation (8) above, correlates to the number of bits set to 1 in an input combination. For Example (8) in a degree 4 system, the inputs relating to column one are {0001, 0010, 0100, 1000} The coefficient multiplier, $b_i$ from Equation (8), specifies the number of rows to be included in a sum-of-products representation of a function to be approximated. If the multiplier for basis one was three, $x_0 x_1' x_2' x_3' + x_0' x_1 x_2' x_3' + x_0' x_1' x_2' x_3$ would be one of the four possible ways it could be implemented. The set of inputs for each basis function is mutually exclusive. Therefore, the sum-of-products implementation for each basis function approximating a target function F( )can be summed to form the implementation for the function.

A function of a given degree represented by basis functions is defined by the coefficient multiplier $b_i$. An optimization method—such as global optimization or genetic algorithm—can be devised to leverage this definition. Using Matlab's genetic algorithm the coefficient multipliers can be optimized to fit a function. An optimization code is provided below for degree four as an example, where coeff0 is used for $b_0$, and so on. From the optimized coefficients, a sum-of-products implementation that fits the desired function can be obtained. The following pseudocode may include instructions used in processing circuitry or a computing device of this disclosure.

Pseudocode.

```
% principle column optimization script for degree 3 gamma
lb = [1,1,1,1];
ub = [2,4,4,2];
intCon = 1:4.;
options = gaoptimset('Generations',300);
% bounds set using degree choose coeff #
coeff0 = 0:1;
coeff1 = 0:3;
coeff2 = 0:3;
coeff3 = 0:1;
x = 0:0.001:1;
y = x.^.045;
[xOpt,fVal] = ga(@(coef)objectiveFunctionDegree3(coef,coeff0,coeff1,...
    coeff2,coeff3,y),4,[ ],[ ],[ ],[ ],lb,ub,[ ],intCon,options);
fVal
xOpt
%objective function
function G = objectiveFunctionDegree3(x,coeff0,coeff1,coeff2,coeff3,...
        lineData)
    xPoints = 0:0.001:1;
    y = genPointDegree3(xPoints,[coeff0(x(1)),coeff1(x(2)),...
        coeff2(x(3)),coeff3(x(4))]);
    difference = lineData - y;
    G = sum(abs(difference))/1001; %average mean error
end
%error calculation
function f = genPointDegree3(xpoint, coeffs)
    func=@(x) (x.^3)*coeffs(1)+(-x.^3+x.^2)*coeffs(2)+...
        (x.^3-2*x.2+x)*coeffs(3)+ (-x.^3+3*x.^2-3*x+1)*coeffs(4);
    f = feval(func,xpoint);
end
```

Tables IIB-IV provide comparisons of the method described here and other stochastic works that include Bernstein Polynomial implementation, state-machine-based methods, combinational logic implementing Maclaurin series, and dynamical systems with feedback. All implementations for Tables IIB-III include a ten-bit binary equivalent resolution. Tables IIB-III compare accuracy of computation, hardware resource usage, and computation latency. There also may be errors that are introduced in the results when deviating from the flushed-ones input format, which becomes relevant when implementing circuits with feedback or multi-level logic.

TABLE IIB

The mean absolute error (MAE) between the real-valued functions and various approximations

| Function | Proposed | Other Stochastic | Ratio |
|---|---|---|---|
| $\gamma(x) = x^{0.45}$ | 0.0245 | 0.0215 | 1.14 |
| $(1 + \tanh(4(2x - 1)))/2$ | 0.0174 | 0.465 | 0.37 |
| $\cosh(x) - 1$ | 0.0045 | 0.0077 | 0.58 |
| $e^{(x-1)}$ | 0.0077 | 0.0127 | 0.60 |
| $f_{x6}(x)$ | 0.0053 | 0.0103 | 0.52 |

TABLE III

The absolute error between the real-valued functions and various approximations: the mean absolute error (MAE), and the maximum error (Max Err.)

| Function | Proposed W = 8 MAE | Proposed W = 10 MAE | Proposed W = 12 MAE | Previous stochastic W = 10 MAE | Ratio | Previous stochastic W = 10 maximum error |
|---|---|---|---|---|---|---|
| Gamma | 0.0221 | 0.0128 | 0.0094 | 0.0214 | 1.67 | 0.095 |
| Tanh | 0.0168 | 0.0056 | 0.0048 | 0.0465 | 8.30 | 0.152 |
| Cosh | 0.0178 | 0.0048 | 0.0024 | 0.0077 | 1.60 | 0.013 |
| exp | 0.0142 | 0.0095 | 0.0063 | 0.0127 | 1.33 | 0.019 |

Table IIB shows the mean absolute error (MAE) numbers of the proposed method and other stochastic studies. The "Proposed W=10" column shows the results of the architecture of FIGS. 4A and 4B with N=1024 parallel input bits. The proposed method shows lower approximation error compared to other stochastic work, which show between 1.33x to 8.30x times error compared to the proposed method. The error of the previous stochastic method is highly dependent on the input value x and random fluctuations when generating input streams. The last column shows the maximum absolute error of the previous works, over all possible inputs to the function. Note that for a fixed x, the error may change depending on the realization of the random bit stream sequence generated to represent x. Consequently, each reported maximum error is calculated by averaging over K=1000 Monte Carlo trials. All experiments in this subsection are done in Matlab using Matlab's rand function for other work (in practice, low-cost LFSRs may be used, which have lower random quality).

FIGS. 9A-9J are graphs illustrating two methods of performing operations. FIGS. 9A-9J show graphs of the functions using the proposed method (top row) and other stochastic work (bottom row). The other stochastic works show a lot of fluctuations, whereas the proposed method is deterministic and follows the target function well.

Figure 10:
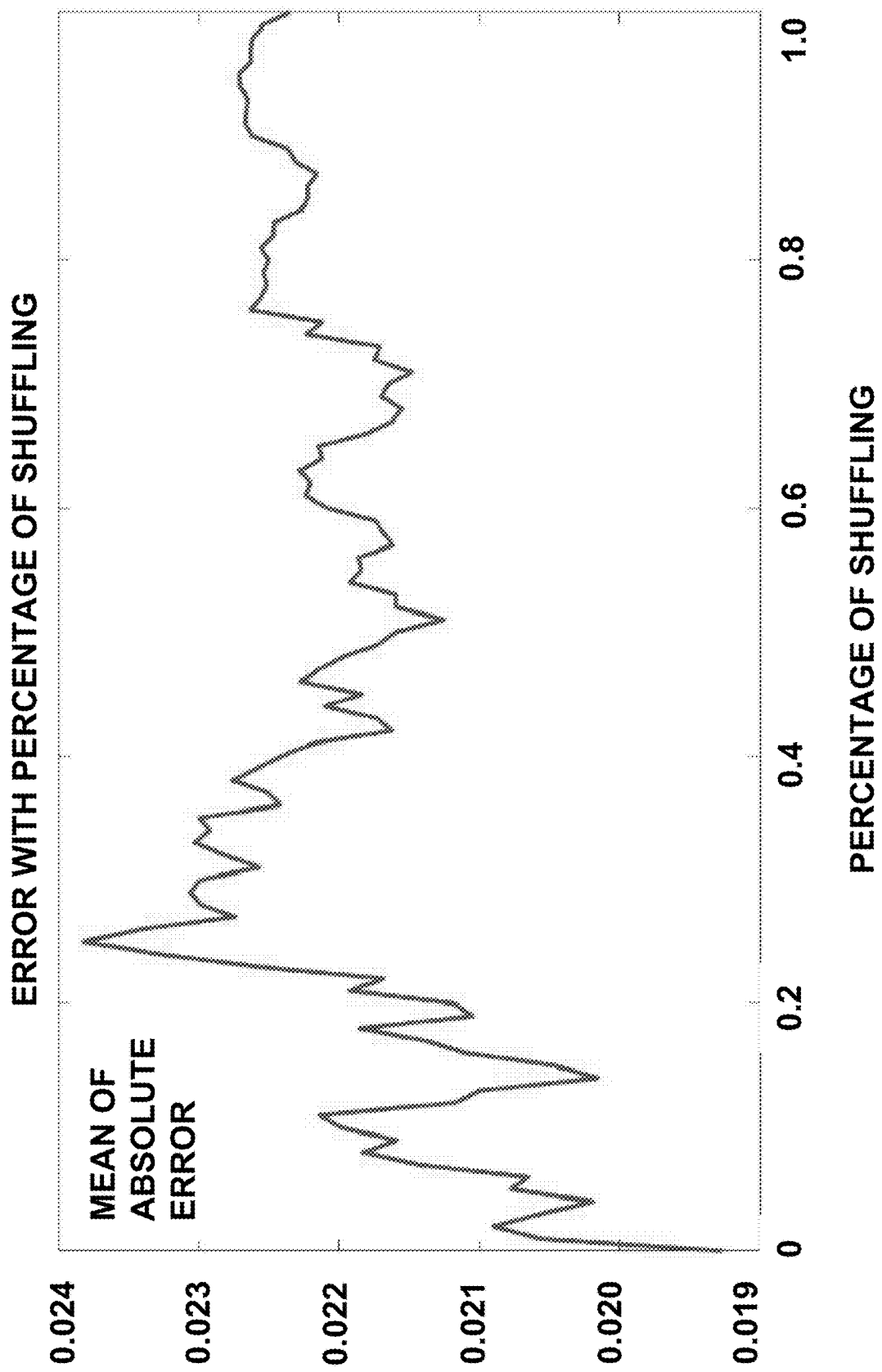
FIG. 10 is a graph of multi-level circuit error introduced when an input bit stream is not flushed or shuffled.

FIG. 10 is a graph of multi-level circuit error introduced when an input bit stream is not flushed or shuffled, e.g., when the output of the core logic 430B in FIG. 4B is not sorted to make it left-flushed. The cube-sweeping algorithm is based on the assumption that the input stream is left-flushed. This condition may be violated if there are multi-level circuits, as is the case in the tanh implementation or FIG. 4B, or in the case of iterative functions such as fx6. FIG. 10 shows how much error is introduced in the computation as the input bit stream is randomly perturbed. The X axis shows what percentage of bits were relocated or moved to a different location, and the Y axis is the error in the output. The graph uses the gamma function but other functions behave similarly. Each point in the graph is the average error over 1000 runs. In practice, the amount of bit displacement is small, as can be seen in FIGS. 9C and 9D.

All of the hardware designs were implemented in Verilog and compiled on Kintex 7 XC7K325T-1FFG900C FPGAs using the Vivado default design flow, made by Xilinx, Inc., of San Jose, Calif. For each function, there are three methods to implement: a ten-bit wide conventional binary, 1024-bit wide serial stochastic (i.e., other stochastic work) and the proposed method: 1024-bit parallel bits. Table IV shows the area and delay results, and is divided into these three groups. Columns 2-4 of Table IV show the number of look-up tables (LUTs) and flip-flops (FFs) used to implement the function, and the critical path delay. Column 5 labeled "Cy" shows the number of clock cycles needed to calculate the function (more details below). The A×D column shows the area× delay value, which is the multiplication of the LUT, Delay and Cy columns. Finally, the "Ratio" column shows the ratio of the other stochastic work and the proposed method to the conventional binary.

TABLE IV

FPGA area and delay results. The proposed method is compared against the conventional binary, and other stochastic computing methods. All use ten bits of resolution and are implemented on the same FPGA chip.

| Function | LUT | FF | Delay | Cy | A × D | Ratio |
|---|---|---|---|---|---|---|
| Binary Architecture | | | | | | |
| γ | 11335 | 10 | 29.99 | 1 | 339936.65 | 1 |
| tanh | 1193 | 260 | 9.1 | 20 | 217126.00 | 1 |
| cosh | 1193 | 260 | 9.10 | 10 | 108563.00 | 1 |
| exp | 1203 | 270 | 9.10 | 10 | 109473.00 | 1 |
| ƒx6 | 13167 | 10 | 22.14 | 1 | 291517.38 | 1 |
| Avg | | | | | 213323.21 | 1.00 |
| Other Stochastic Work | | | | | | |
| γ | 92 | 81 | 4.32 | 1024 | 406978.56 | 1.20 |
| tanh | 111 | 10 | 1.10 | 1024 | 125030.40 | 0.58 |
| cosh | 154 | 99 | 0.99 | 1024 | 156119.04 | 1.44 |
| exp | 100 | 70 | 0.98 | 1024 | 100352.00 | 0.92 |
| ƒx6 | 44 | 53 | 4.00 | 16 | 2816.00 | 0.01 |
| Avg | | | | | 158259.20 | 0.74 |
| Proposed Architecture | | | | | | |
| γ | 3587 | 2056 | 6.52 | 1 | 23387.24 | 0.07 |
| tanh | 5648 | 3079 | 6.24 | 1 | 35243.52 | 0.16 |
| cosh | 1372 | 1381 | 6.59 | 1 | 9041.48 | 0.08 |
| exp | 1749 | 1674 | 6.24 | 1 | 10913.76 | 0.10 |
| ƒx6 | 3580 | 2101 | 6.10 | 1 | 21838.00 | 0.07 |
| Avg | | | | | 20084.80 | 0.09 |
| Ratio of proposed method to other stochastic | | | | | | 0.13 |

For the conventional implementation of tanh, cosh and exp, both polynomial approximation and coordinate rotation digital computer (CORDIC) were tried, and in all three cases CORDIC resulted in better area×delay, so CORDIC was used for the tanh, cosh, and exp functions. It takes ten iterations of CORDIC to evaluate cosh and exp, hence the number ten under the "Cy" column for these designs. For tanh, there are an additional ten cycles to perform division. For the other stochastic methods, the hardware was implemented based on the descriptions of other work and used LFSRs for the random number generators. Using large combinational logic to save on LFSRs did not result in improved A×D values. The LFSRs need 1024 cycles to evaluate 1024 bits in the output bit stream. The case of fx6 is special because the function used a LUT to speed-up the computation by using a larger area, which may use sixteen cycles. For the implementation of the functions, the architecture of FIGS. 4A and 4B was used, including the thermometer encoder and the decoder, except that in the case of tanh, there are two levels of shuffling networks.

The proposed method takes only 9% of the A×D of the conventional binary method, and 13% of other stochastic approaches on average. The reason that the proposed method can outperform the conventional binary method is that the proposed method can pack a degree-k polynomial in one k-LUT logic unit of an FPGA (using $2^W$ copies of that in parallel). The reason that the proposed method can outperform other stochastic methods is that the proposed method does not need costly random number generators. Instead, the proposed method only uses one copy of the input bit stream, and minimizes the number of coefficients.

As described herein, the proposed method may implement parallel "stochastic" logic using a shuffling and sub-sampling network, along with stochastic logic core that may avoid using constant coefficients. The proposed method may work very well in terms of quantization error, and A×D product. In practice, the proposed method may work well for multi-level logic and even circuits with feedback. The proposed method may even outperform conventional binary implementations in terms of area×delay by 10.6x for W=ten-bit resolutions.

Figure 11:
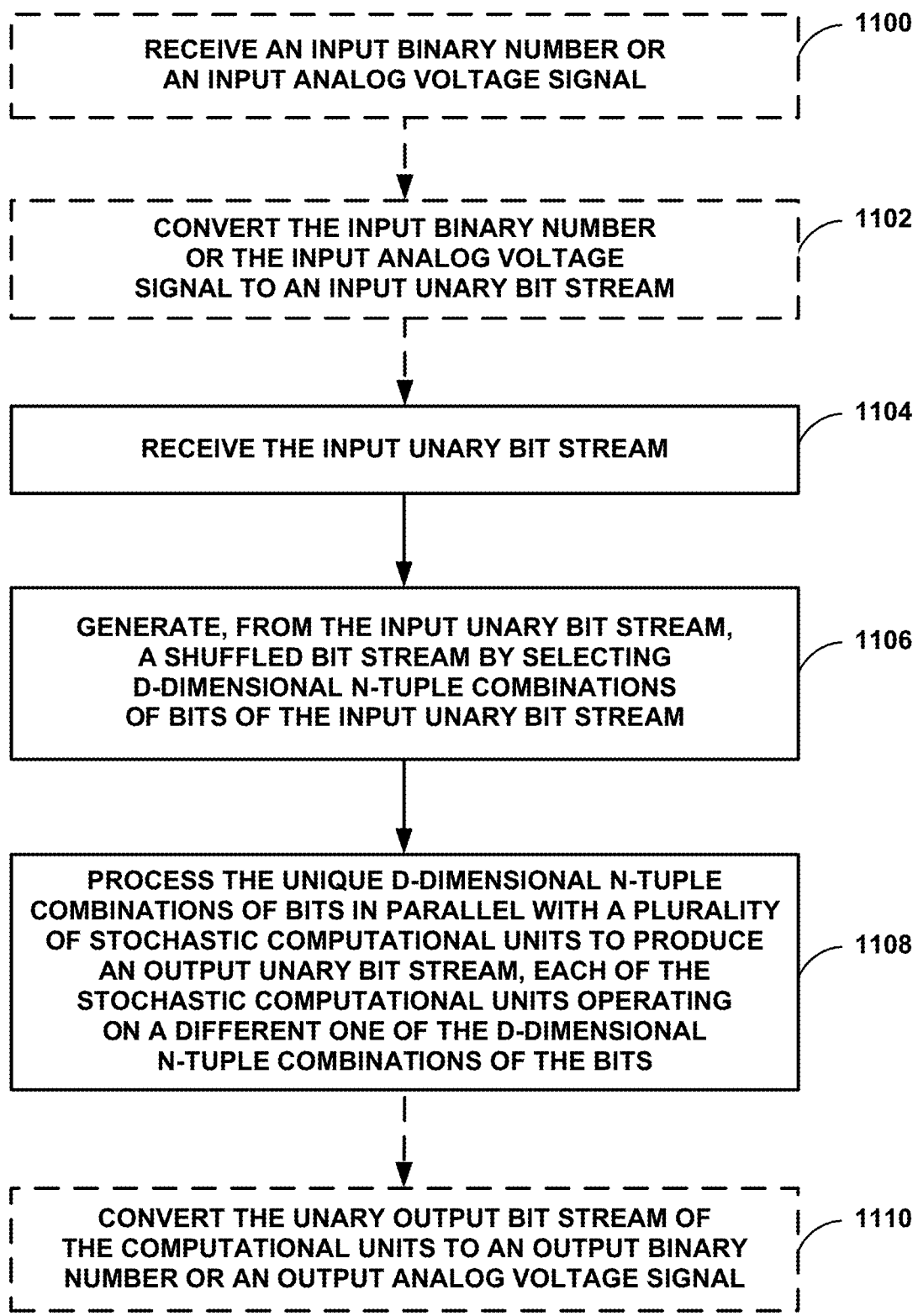
FIG. 11 is a flowchart illustrating example techniques for performing operations on shuffled bit streams, in some examples of this disclosure.

FIG. 11 is a flowchart illustrating example techniques for performing operations on shuffled bit streams, in some examples of this disclosure. The techniques of FIG. 10 are described with reference to the circuitry of FIG. 4A, although other components may perform similar techniques.

In the example of FIG. 11, thermometer encoder 410A may receive binary input 400A, which may be a binary number or an analog voltage signal (1100). Thermometer encoder 410A may then convert binary input 400A to an input unary bit stream (1102). In the example of FIG. 10, shuffling network 420A receives the input unary bit stream (1104). Shuffling network 420A may receive the input unary bit stream from thermometer encoder 410A as eight parallel bits, in the example of FIG. 10. In some examples, the eight parallel bits of the input unary bit stream may correspond to a three-digit binary number.

In the example of FIG. 11, shuffling network 420A generates, from the input unary bit stream, a shuffled bit stream by selecting d-dimensional n-tuple combinations of bits of the input unary bit stream (1106). For example, shuffling network 420A may be configured to generate a first d-dimensional n-tuple combination by delivering the first bit and the second bit to a first logic gate of core logic 430A. Shuffling network 420A may be configured to generate a second d-dimensional n-tuple combination by delivering the third bit and the fourth bit to a second logic gate of core logic 430A.

In the example of FIG. 11, core logic 430A processes the unique d-dimensional n-tuple combinations of bits in parallel with a plurality of stochastic computational units to produce an output unary bit stream (1108). Core logic 430A may include eight computational units (e.g., logic gates), each configured to receive a unique d-dimensional n-tuple combination of bits. Each stochastic computational unit may be configured to operate on a different d-dimensional n-tuple combination of bits. In the example of FIG. 11, decoder 440A may then convert the output unary bit stream to binary output 470A, which may be a binary number or an analog voltage signal (1110).

In the following description, additional examples are described with respect to the processing of data using shuffling circuitry and stochastic logic circuitry. In some examples, a thermometer encoder is configured to convert the lower portion of a binary number to a unary bit stream for processing by the shuffling circuitry and a plurality of stochastic logic circuitry. The remainder of the binary number is used to select one of the stochastic logic circuitry and a binary bias to be added to the output of the decoder.

The low area advantage of stochastic computing can come at an exponential price in latency or area, making the area×delay cost unattractive. A hybrid binary/unary representation to perform computations can potentially reduce the area of a stochastic computing circuit. A hybrid binary/unary device may first divide the input range into a few sub-regions selected by the higher bits of the input binary number, which corresponds to dividing the original function into a few sub-functions, then perform unary computations on each sub-region (sub-function) individually, and finally pack the outputs of all sub-regions back to compact binary. The result of breaking the original function into smaller sub-functions is that both the unary encoding and the unary function evaluation become exponentially less costly. A synthesis methodology and a regression model can be used to predict an optimal or sub-optimal design in the design space.

Hybrid binary/unary representation outperforms the binary and fully unary methods on a number of functions and on a common edge detection algorithm. In terms of area×delay cost, the cost of hybrid binary/unary representation is on average only 4.0% and 16.2% of the binary for 8- and 10-bit resolutions, respectively, which is 2-3 orders of magnitude better than the results of traditional stochastic methods. The hybrid binary/unary representation is not competitive with the binary method for high-resolution oscillating functions such as sin(15x).

In stochastic computing and unary computing methods, the generation of the bitstreams can be the major area and power cost. For example, the thermometer encoding unit generates the $2^N$ values for the parallel bitstreams, out of which the first M carry a value of '1', and the rest carry a value of '0' to represent $M=2^N$, hence the name "thermometer" encoding. The thermometer encoder can take up a majority of the area of the whole design, hence making it not competitive with binary designs when the number of inputs increases (which was the case in the median filtering implementation). The hybrid binary-unary computing approach can shorten the input region of the thermometer encoder to reduce the required bit-length of the encoder and, also, to simplify function implementations in the fully unary domain. The hybrid binary-unary computing splits the $[0 \ldots 2^N]$ input binary region into k regions with shorter bit-lengths. The regions would not necessarily have the same length. The corresponding sub-functions corresponding to each region are defined as shown in Equation (9).

$$f = g(x) = \begin{cases} g_1(x) & 0 < x \le x_1 \\ \ldots \\ g_k(x) & x_{k-1} < x \le x_k \end{cases} \quad (9)$$

Figure 15:
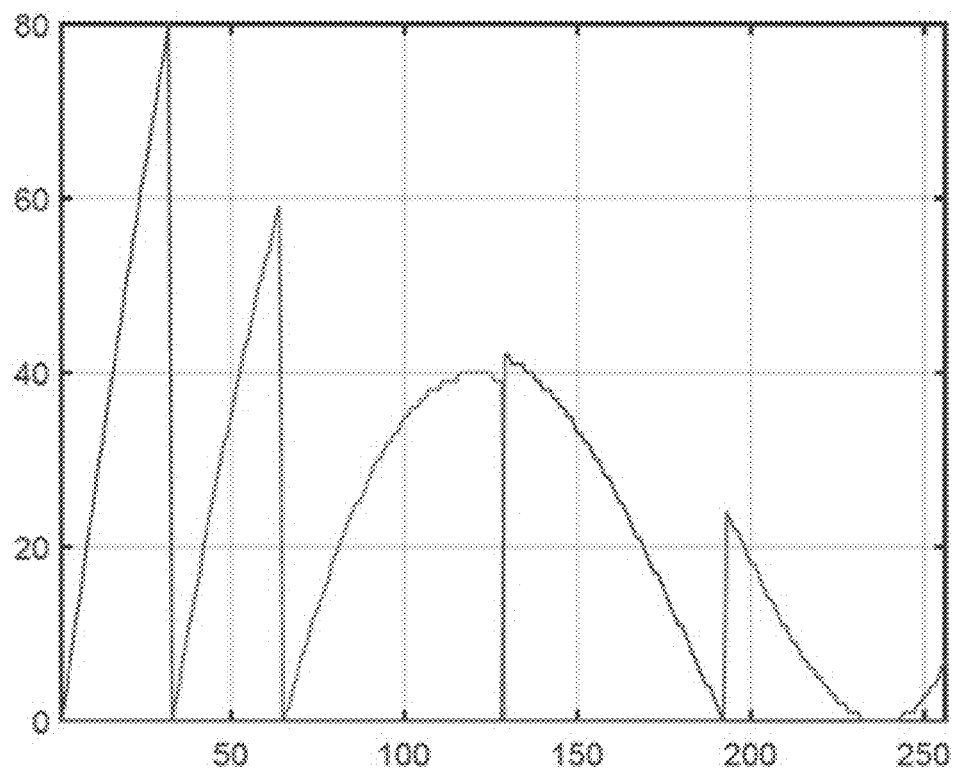
FIG. 15 is a graph illustrating smaller sub-functions without bias.
Figure 16:
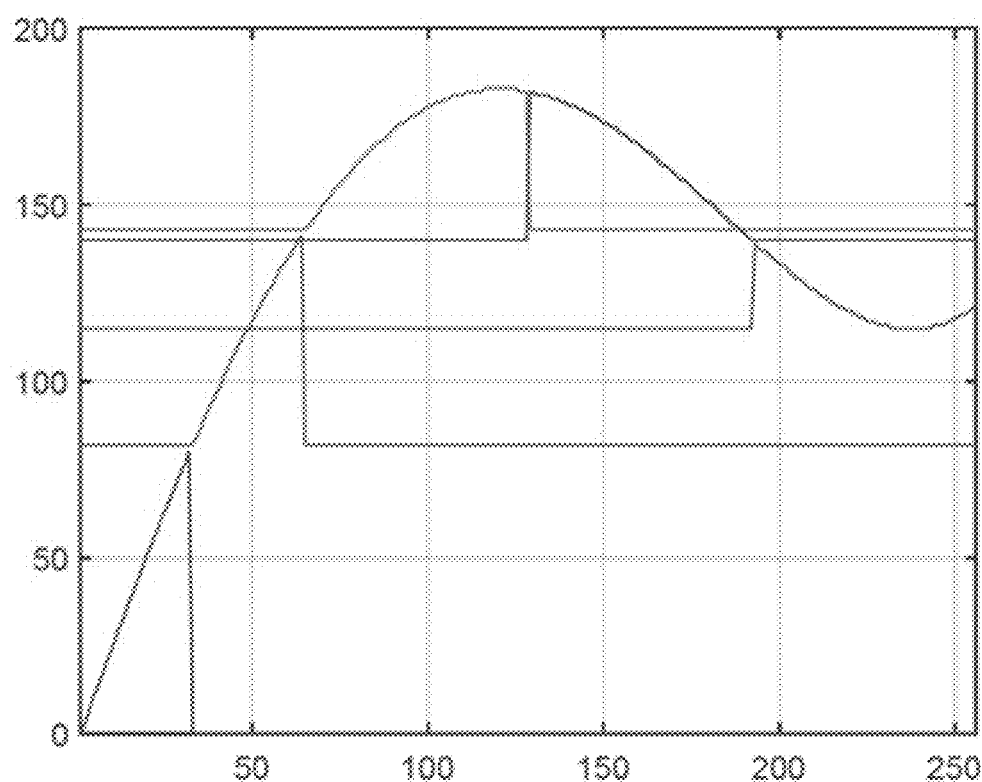
FIG. 16 is a graph illustrating smaller sub-functions with bias.

In order to avoid the offsets $x_i$, each sub-function can be modified as shown in Equation (10) by shifting their input. Therefore, each subfunction can be implemented using the fully unary approach. The output of each subfunction, then, is multiplexed to produce g(x).

$$f = g(x) = \begin{cases} g_1(x) & 0 < x \le x_1 \\ \ldots \\ g_k(x) & x_{k-1} < x \le x_k \end{cases} \quad (10)$$

$$= \begin{cases} b_1 + h_1(x') & 0 < x' \le x_1 \\ \ldots \\ b_k + h_k(x') & 0 < x' \le x_k - x_{k-1} \end{cases}$$

Where $b_i (1 \le i \le k)$ are the bias values added to simpler functions $h_i(x)$. Since each sub-function has narrower input and output ranges than g(x), therefore, they need smaller thermometer encoders at their input and smaller unary-to-binary decoders at their output, and the function $h_i(x)$ itself would be (exponentially) cheaper than g(x) to implement in terms of area cost and critical path delay. An example of the $g_i(x)$ functions is shown in FIG. 16, and functions $h_i(x)$ are shown in FIG. 15.

Figure 12:
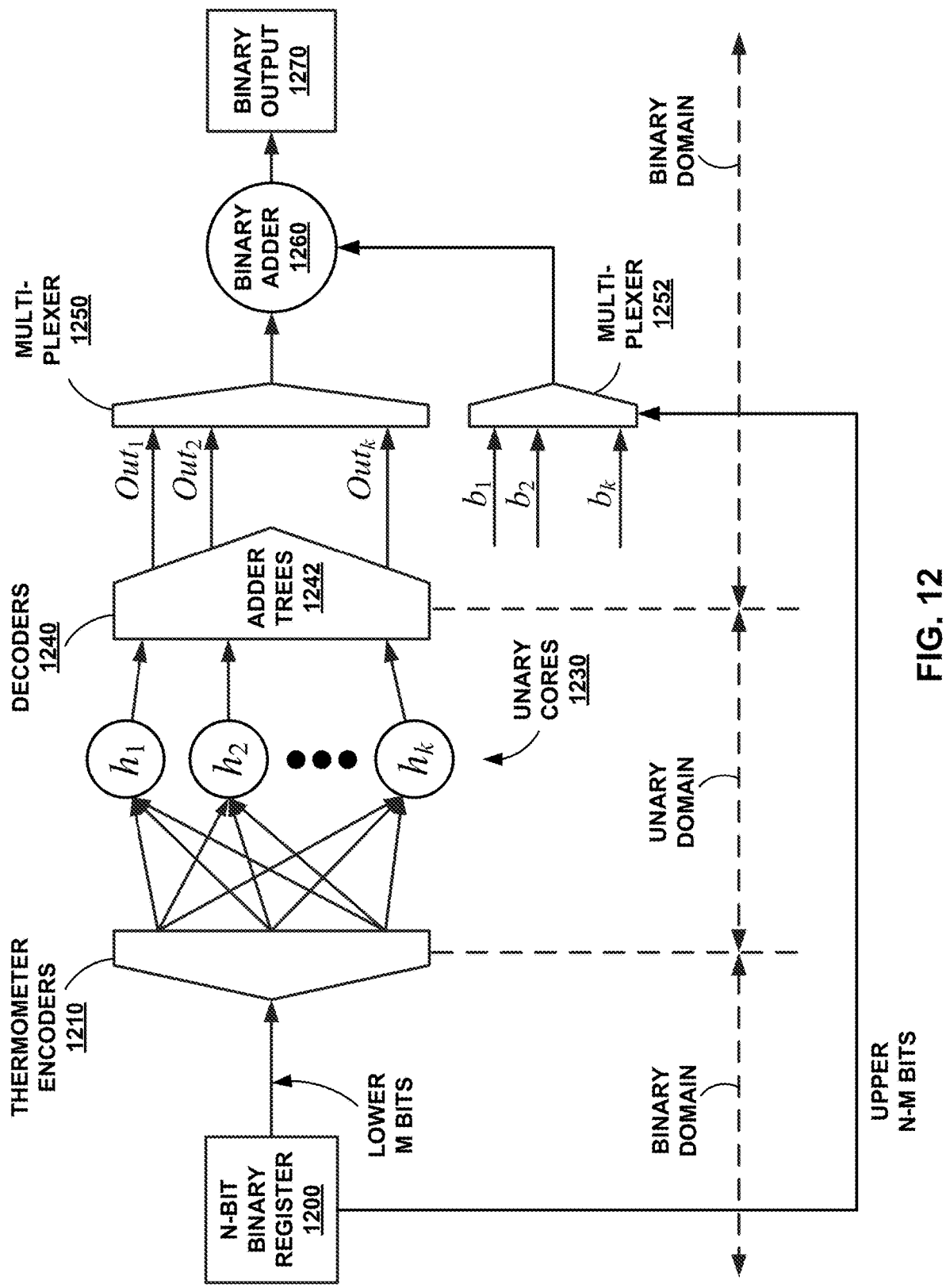
FIG. 12 illustrates a possible architecture for a hybrid binary-unary method.

FIG. 12 illustrates a possible architecture for a hybrid binary-unary method. The overall architecture of FIG. 12 includes three stages or domains. In the first stage, N-bit binary register 1200 and the input of thermometer encoders 1210 handle numbers in the binary domain. An N-bit binary number stored in register 1200 can include a first portion (e.g., the lower M bits) and a second portion (e.g., the upper N-M bits). Thermometer encoder(s) 1210 may be configured to convert binary numbers from binary register 1200 to a unary bit stream with a left-flushed unary number format such that all the 1's appear first, followed by 0's. The input range is split into a few smaller regions, therefore the lower M bits of the input binary number value are fed to encoder(s) 1210. The thermometer encoder 1210 is an example of encoders 410A and 410B shown in FIGS. 4A and 4B, but operating on exponentially fewer bits (e.g., only the lower M bits). The device can include a plurality of unary cores 1230 (e.g., $2^{(N-M)}$ copies), each of which would be similar to logic circuitry 120, core logic 430A, or core logics 430B and 450B shown in FIGS. 1, 4A, and 4B. The shuffling network and potentially decoder 1240 can be shared across different copies of unary cores 1230. Multiplexer 1250 selects the output of one of the core logics 1230, and multiplexer 1252 selects the binary bias number to be added to the selected sub-function to implement the original function. Multiplexers 1250 and 1252 may receive the second portion—for example (N-M) bits—of the binary number as control inputs. Multiplexers 1250 and 1252 may be configured to operate as a multi-level lookup table to combine the sub-functions and offset values into a single function covering the entire range of input values.

In the second stage, unary cores 1230 perform operations on unary bit streams in the unary domain. Unary cores 1230 may be configured to receive the unary bit stream generated by thermometer encoders 1210. In some examples, a shuffling network may be configured to generate shuffled bit streams based on the output of encoders 1210, and unary cores 1230 may receive the shuffled bit streams. Each of unary cores 1230 can process a unary bit stream (e.g., a shuffled bit stream) based on a sub-function to produce an output unary bit stream. Binary decoders 1240 can include adder trees 1242 for converting the output unary bit streams to binary numbers, as indicated in FIG. 12 by $Out_1$ through $Out_k$. Binary decoders 1240 are examples of decoders 440A and 460B shown in FIGS. 4A and 4B, but decoding exponentially fewer bits.

In the third stage, binary decoders 1240 generate output binary numbers for selection by multiplexer 1250. Multiplexer 1250 may be configured to select one of the output binary numbers based on the upper N-M bits of the binary number from register 1200 (e.g., a second portion of the input binary number). Multiplexer 1252 may be configured to select an offset value (e.g., a bias value) based on the upper N-M bits of the binary number from register 1200. Binary adder 1260 can perform bias addition by adding the outputs of multiplexers 1250 and 1252 to generate binary output 1270.

For example, register 1200 can store an eight-bit binary number that represents values from zero to 255. Thermometer encoder 1210 can receive and convert the lower six bits (e.g., the six least significant bits) of the binary number to a 64-bit unary bit stream. Each of unary cores 1230 can operate on the unary bit stream, or a shuffled version of the unary bit stream, to generate output unary bit streams, which may have a resolution of 64 bits. In some examples, each of unary cores 1230 processes bit streams based on a unique sub-function. Thus, the output unary bit stream generated by each of unary cores 1230 may represent the result of a different computational operation, such as a linear operation, a polynomial operation, an exponential operation, and/or any other computational operation.

Decoders 1240 may be configured to generate four six-bit output binary numbers based on the output unary bit streams received from unary cores 1230. In examples in which all of unary cores 1230 have the same output resolution, the adder tree 1242 can be shared and placed after Multiplexer 1250. Multiplexer 1250 receives all of the binary numbers from decoders 1240 and can select one of the binary numbers for output. Multiplexers 1250 and 1252 may receive the upper two bits of the binary number and select one of four input values. For example, in examples in which both of the upper two bits are zeroes, multiplexers 1250 and 1252 may be configured to output the respective first input value (e.g., $Out_1$ and $b_1$ shown in FIG. 12).

The $h_i(x)$ functions of unary cores 1230 may have the same input range, enabling them to share thermometer encoders 1210, which will translate to a lower overall implementation cost. The second stage contains the set of unary cores 1230 (e.g., "unary computation cores") that implement sub-functions $h_i(x)$. The third stage of the architecture uses adder trees 1242 to convert individual $h_i(x)$ function outputs to binary numbers. Multiplexer 1250 then multiplexes the sub-function outputs based on the upper bits of the original binary input received from register 1200. An appropriate bias value ($b_i$) is added to the corresponding binary sub-function output to produce the final output. The architecture of FIG. 12 can reduce the cost of thermometer encoder 1210 and unary cores 1230 when implementing polynomial and nonpolynomial functions.

Figure 13:
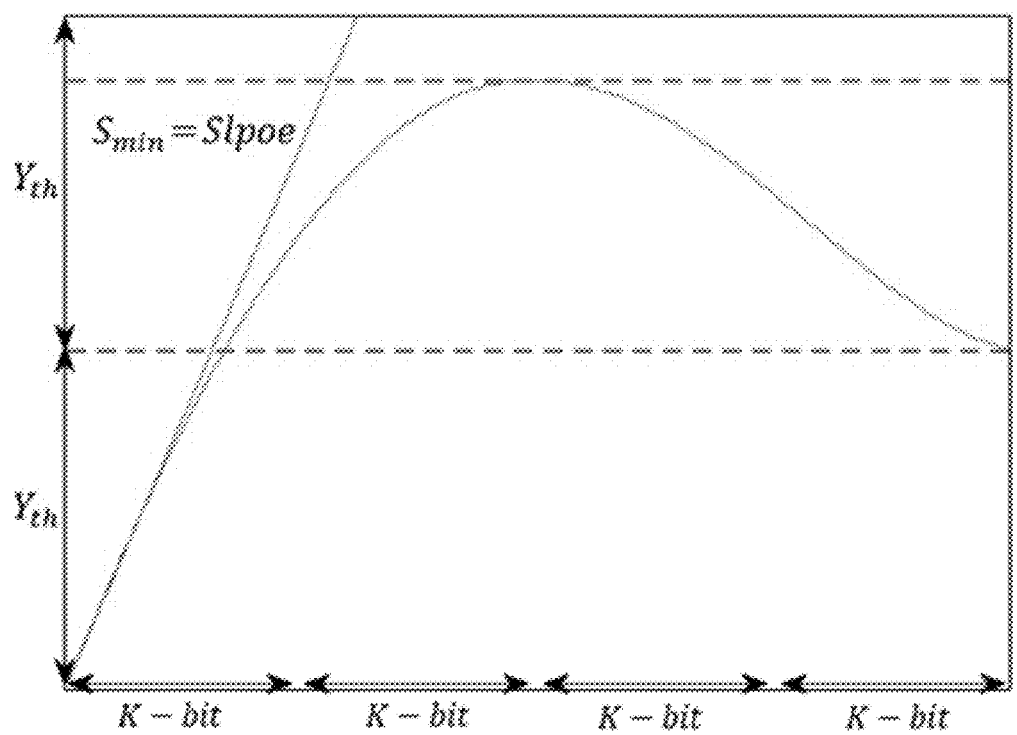
FIG. 13 is a graph illustrating a function breaking methodology.

FIG. 13 is a graph illustrating a function breaking methodology. There are a number of parameters to guide the process of breaking a function into smaller sub-functions. Three of the most effective parameters are shown in FIG. 13. First, $Y_{threshold}$, which represents the maximum allowable output range of the (sub-)function in each region. Second, $L_{min}$, which represents the minimum possible range of each region. Third, $S_{max}$, which represents the maximum allowable slope of the function in each region.

The hybrid binary-unary computing approach can decompose a function from an N-bit binary fixed-point version of the function in the following steps. First, divide the N-bit input range into k-bit distinct ranges. Second, divide the length of each region by two if the output domain of that region violates the $Y_{threshold}$ criteria. This reduction can be repeated for each new region until the output range of that region passes the $Y_{threshold}$ criteria or the input range of the function gets as small as $L_{min}$. Third, divide the length of each region by two if the slope of the function in that region violates the $S_{max}$ criteria. This reduction can be repeated for each new region until the output and the input domains of that region pass $S_{max}$ and $L_{min}$ criterion, respectively. Fourth, find $h_i(x)$s and their corresponding bias values. Fifth, generate HDL code to implement g(x) using $h_i(x)$s and required encoder(s) and decoder(s). If the final set of functions $h_i(x)$s have different x ranges, then the selection method can use overlapping upper and lower bits of the original input (e.g., for an 8-bit input, three upper bits can be used as control circuitry of multiplexers 1250 and 1252, and the 6 lower bits can be used as input to the thermometer encoder 1210).

The synthesizer reports upper bounds of subfunction's input and output ranges which are used to generate the HDL code. The upper bound of inputs determines the required bit-length of encoders and the upper bound of outputs determines the required bit-length of the decoders. Moreover, the synthesizer reports the number of required logic gates to implement sub-functions. The proposed synthesizer tries to find the optimal or sub-optimal design without affecting the output quality.

Figure 14:
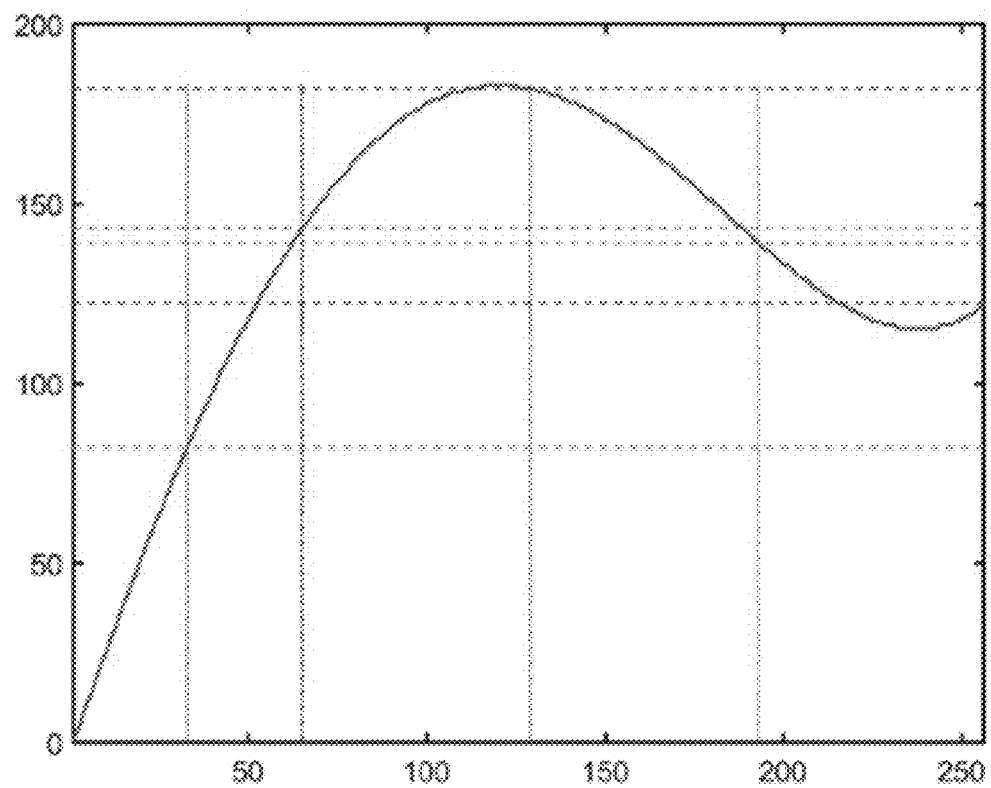
FIG. 14 is a graph illustrating synthesized results of an arbitrary function methodology

FIG. 14 is a graph illustrating synthesized results of an arbitrary function methodology. FIG. 15 is a graph illustrating smaller sub-functions without bias. FIG. 16 is a graph illustrating smaller sub-functions with bias. FIGS. 14-16 show the results of the synthesis process for an arbitrary function. In the example of FIGS. 14-16, the following values can be set: k=6, $Y_{threshold}$=26, $L_{min}$=23, and $S_{max}$=3. FIG. 14 shows all input regions and corresponding output regions. The synthesis approach divides the input region into different small regions and then considers g(x) corresponding to each region as an individual sub-function. For example, there may be two 5-bit (e.g., 25 distinct x values) regions and four 6-bit regions. Thus, for the example shown in FIGS. 14-16, a hybrid binary-unary architecture can include 5-bit and 6-bit thermometer encoders and then share the 5- and 6-bit encoders between required sub-functions. In examples in which at least 5 lower bits of the input are used for unary computation, the multiplexers can use the three upper bits as control inputs at the third stage in the hybrid binary-unary architecture.

FIG. 15 shows all sub-functions $h_i(x)$. The proposed approach has converted a complex non-monotonic function into a few small monotonic functions and just one simple and small non-monotonic function. Because g(x) in FIG. 16 is nonmonotonic in regions 2-5, a unary approach could use many logic gates with multiple inputs. In contrast, a hybrid binary-unary method can break the function into mostly monotonic sub-functions, eliminating the majority of the logic gates and their input size, resulting in unary implementations that require much less hardware resources.

FIG. 16 shows all $h_i(x)$'s corresponding bias values. These bias values are used to produce the final result. Since the hybrid binary-unary computing approach uses shared and smaller encoders as well as implements sub-functions using simple routing networks (or lower logic gate cost), the hybrid binary-unary architecture can implement any complicated function more efficiently compared to previous approaches.

Figure 17:
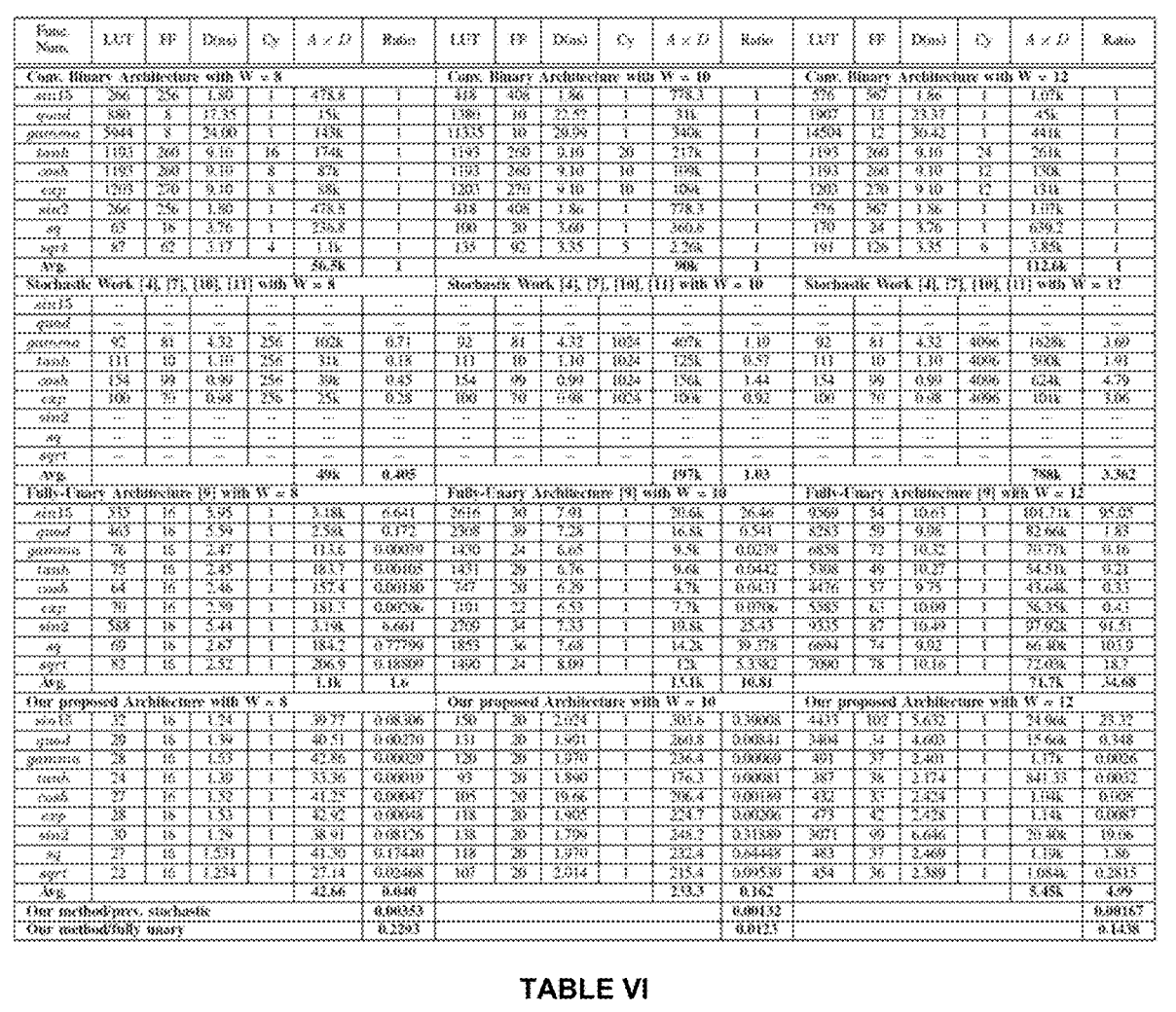

All designs were implemented in Verilog and compiled on Kintex7XC7K70TFBG676-2 FPGAs using the Xilinx Vivado 2016:4 default design flow. Table V shows a number of sample functions that were used to compare different methods. Table VI shown in FIG. 17 shows four methods to implement all functions: the conventional binary, serial stochastic, fully unary method (e.g., the architecture of FIGS. 4A and 4B), and the hybrid binary-unary method (e.g., FIG. 12) with 8-, 10-, and 12-bit resolutions. Table VI shown in FIG. 17 compares these methods in terms of area×delay.

TABLE V

Implemented functions

| Function name | Function |
|---|---|
| sin15 | $\dfrac{1 + \sin(15x)}{2}$ |
| quad gamma | $\dfrac{30x(1-x)(x-0.4)^2}{x^{0.45}}$ |
| tanh | $\dfrac{1 + \tanh(4(2x-1))}{2}$ |
| cosh exp | $\dfrac{\cosh(x) - 1}{e^{x-1}}$ |
| sin2 | $\dfrac{1 + \sin(2x)}{2}$ |
| sq sqrt | $\dfrac{x^2}{\sqrt{x}}$ |

FIG. 17 is Table VI illustrating area and delay results using field-programmable gate arrays. Table VI shown in FIG. 17 shows the area×delay results, and is divided into four groups for each resolution. Columns 2-4 show the number of LUTs and FFs used to implement the function, and the critical path delay. Column 5 labeled "Cy" shows the number of clock cycles needed to calculate the function. The A×D column shows the area×delay product, which is the multiplication of the LUT, Delay, and Cy columns. Finally, the "Ratio" column shows the ratio of the stochastic, fully unary method (FIGS. 4A and 4B) and our proposed architecture (FIG. 12) to the conventional binary. For stochastic implementation, the area cost includes conversions from and to the binary format. The architecture of FIG. 12 was used for the hybrid binary-unary architecture, including thermometer encoder(s) 1210 and decoder(s) 1240. Therefore, the reported cost includes converting from and to the binary format and unary cores.

TABLE VII

Synthesis parameters.

| N | 8, 10, 12 | $L_{min}$ | 2, 4, 8, 16, 32 |
|---|---|---|---|
| k | 4:N − 1 | $S_{max}$ | 2:6 |
| $Y_{threshold}$ | 2:N − 1 | | |

When the resolution increases, the stochastic method starts to perform increasingly worse compared to binary, which is expected given the exponential number of cycles for bitstream representation. The fully-unary method suffers from the cost of the thermometer encoder and an exponential increase in the size of the scaling network and the alternating logic, which gets more pronounced as the resolution increases. The fully unary method can outperform the conventional binary implementation for non-oscillating functions with 8-bit precision. For 10- and 12-bit resolutions the fully unary cannot be competitive with conventional binary implementations even for some of the non-oscillating functions. On the other hand, the hybrid binary-unary method outperforms conventional binary implementations for 8- and 10-bit resolution for all functions, in some cases by orders of magnitude. On average, the hybrid binary-unary method takes only 4.0% and 16.2% of the A×D of the conventional binary, 0.35% and 0.13% of previous stochastic, and 22.93% and 1.23% of fully unary approaches for 8- and 10-bit resolutions, respectively. For 12-bit precision, the hybrid binary-unary method performs worse than the conventional binary method for oscillating functions and square functions, but performs quite well for others.

Based on synthesis parameters bit length N, k, $Y_{threshold}$, $L_{min}$, and $S_{max}$, the proposed synthesis method provides different hardware design options. It may not be practical to perform an exhaustive search of the design space to find the best hardware implementation for higher bit resolutions. Instead, a model can be used to find near-optimal (or optimal) solutions based on certain parameters that estimate the cost of the HDL synthesized circuit. The arithmetic mean and variance of the upper bound of sub-functions' input and output ranges as well as the number of logic gates are important factors in estimating the HDL design cost.

A linear regression model can be developed to estimate the HDL implementation cost. The first five and the eighth functions of Table V can be used to "train" our regression model, and tested its effectiveness on the rest of the functions. To derive the regression parameters, all possible designs were implemented for the training set, using the parameters and ranges shown in Table VII. The proposed area cost model is shown in Equation (11), where $b_i$ and $z_i$ are shown in Table VIII.

$$\text{LUT\_cost} = \sum_{i=0}^{12} b_i \times z_i \quad (11)$$

TABLE VIII

Model parameters.

| $b_i$ | | $z_i$ | |
|---|---|---|---|
| $b_0$ | −28760.3746 | $z_0$ | 1 |
| $b_1$ | 3280.417077 | $z_1$ | N |
| $b_2$ | −521.1131285 | $z_2$ | k |
| $b_3$ | 3.45158634 | $z_3$ | $Y_{threshold}$ |
| $b_4$ | 55.96917283 | $z_4$ | $L_{min}$ |
| $b_5$ | −150.211725 | $z_5$ | $S_{max}$ |
| $b_6$ | 15.08260571 | $z_6$ | $\text{OutDim}_{Max}^*$ |
| $b_7$ | 6.473008135 | $z_7$ | $\text{InDim}_{Max}^*$ |
| $b_8$ | 17.82968283 | $z_8$ | $AM_{UboundIn}^*$ |
| $b_9$ | −11.08795092 | $z_9$ | $AM_{UboundOut}^*$ |
| $b_{10}$ | 15.13624618 | $z_{10}$ | $V\,AR_{UboundIn}^*$ |
| $b_{11}$ | −18.28720036 | $z_{11}$ | $V\,AR_{UboundOut}^*$ |
| $b_{12}$ | 5.669041242 | $z_{12}$ | #XOR gates |

In Table VIII, $\text{OutDim}_{Max}$ is the maximum upper bound of sub-functions' output ranges. $\text{InDim}_{Max}$ is the maximum upper bound of sub-functions' input ranges. $AM_{UboundIn}$ is the arithmetic mean of upper bound of sub-function input ranges. $AM_{UboundOut}$ is the arithmetic mean of upper bound of sub-function output ranges. $V\,AR_{UboundIn}$ is the variance of upper bound of sub-functions' input ranges. $V\,AR_{UboundOut}$ is the variance of upper bound of sub-function output ranges.

TABLE IX

Regression statistics.

| MultipleR | 0.93825 |
|---|---|
| RSquare | 0.88033 |
| AdjustedRSquare | 0.88025 |
| StandardError | 5829.79 |

The regression statistics are presented in Table IX. The R-Square parameter is 0.88, which means there is a relatively linear relationship between inputs and output values of the proposed model, and that 88% of the variations in our training samples are explained by the proposed model.

Figure 18:
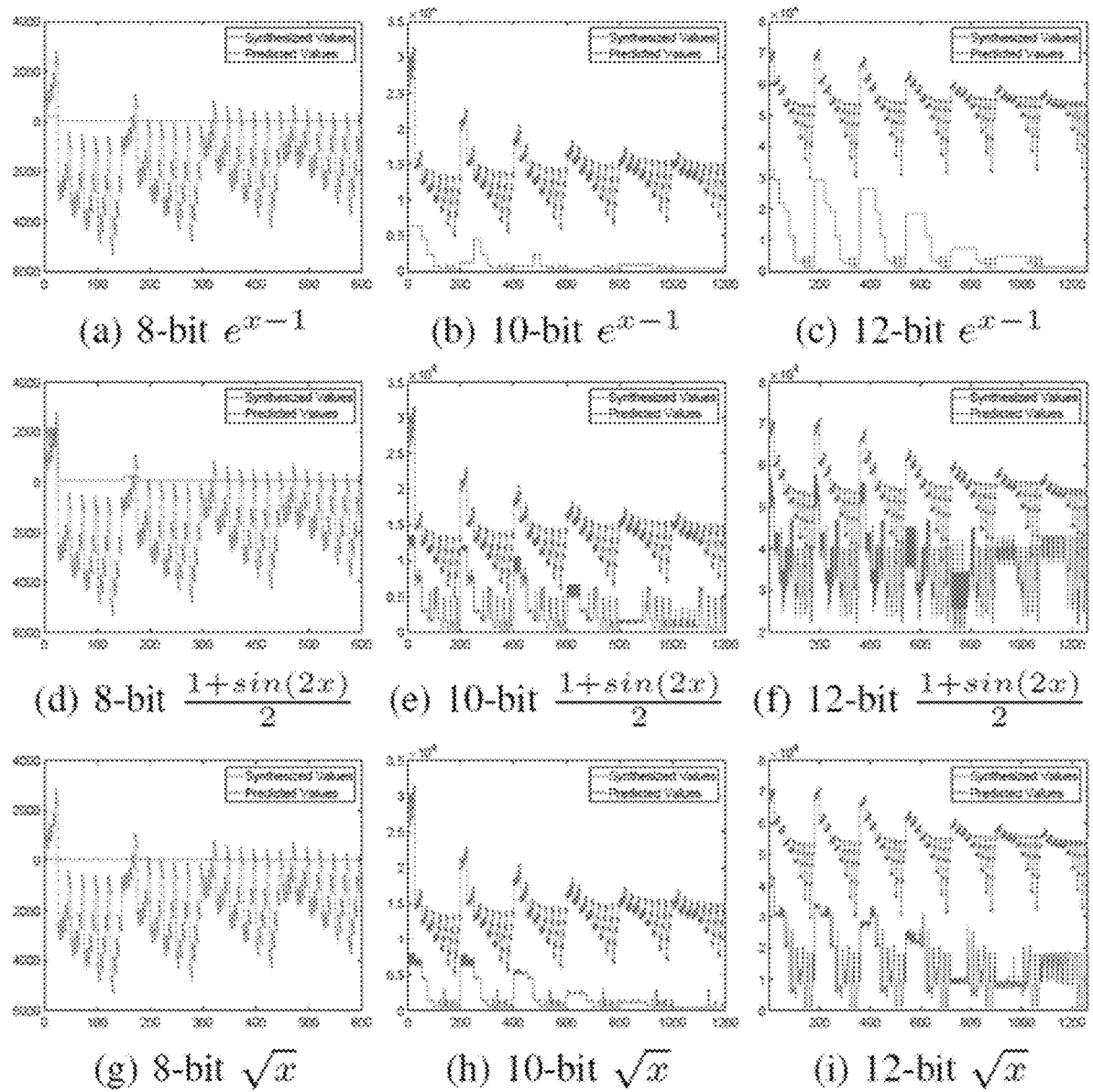
FIG. 18 is a set of graphs of validation test results for exponential and sin 12x for 8-, 10-, and 12-bit resolutions.

FIG. 18 is a set of graphs of validation test results for exponential and sin 12x for 8-, 10-, and 12-bit resolutions. FIG. 18 shows the validation test results of the sixth, seventh, and ninth functions of Table V (test functions). The x-axes show different designs chosen by randomly assigning values to design parameters (600-1200 different designs). The y-axes show the cost. The curves show predicted costs, and the curves also show the exact synthesis cost. FIG. 18 shows that, although the model cannot predict the exact cost, the model can pick the design or configuration parameters that result in an optimal or sub-optimal solution in a majority of cases. In other words, in most cases when the estimator model says a design is best among the 600-1200 implementation options, the real cost of that particular design is also the minimum among all the implementations.

Figure 19:
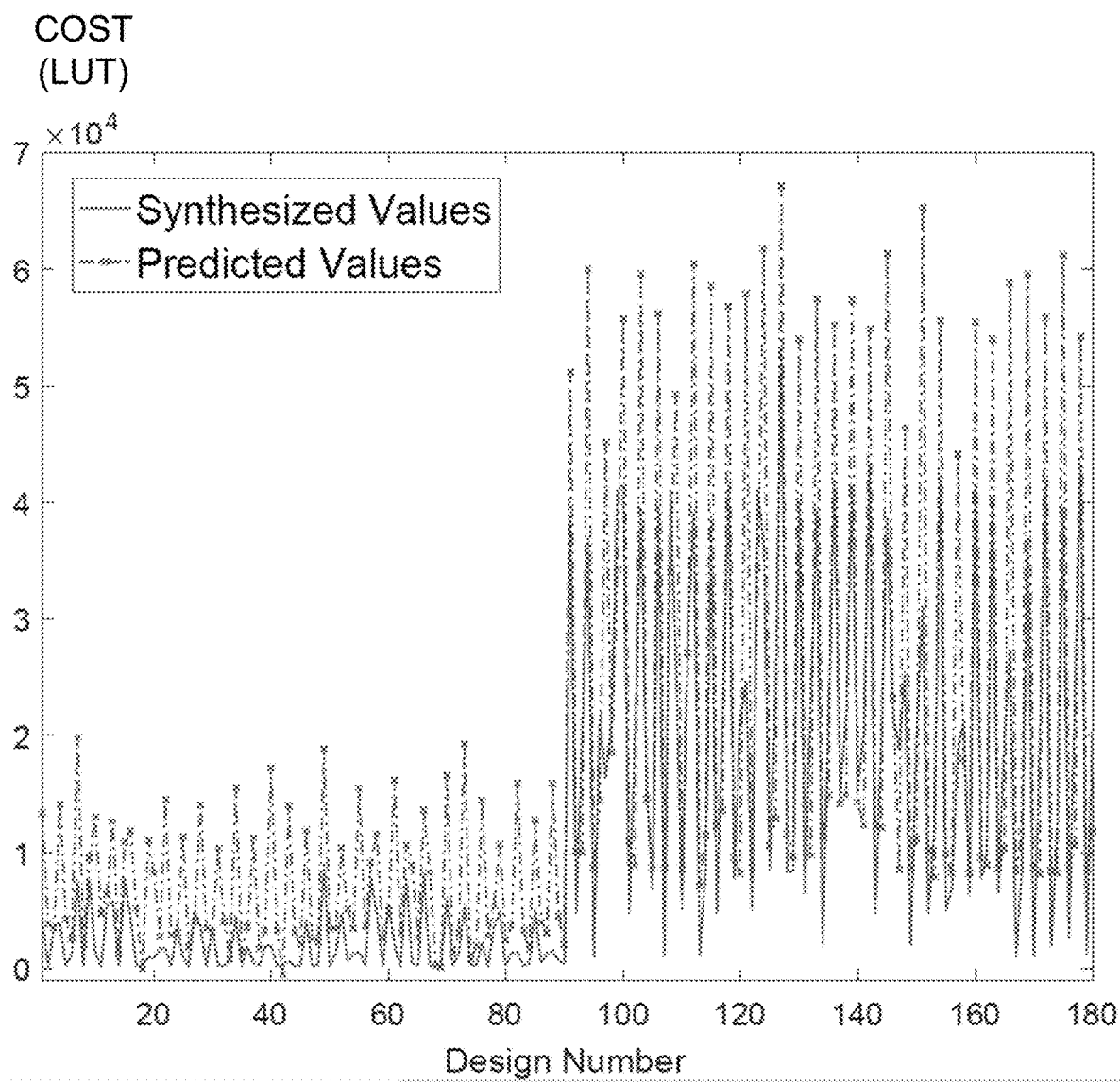
FIG. 19 is a graph of fidelity test results.

FIG. 19 is a graph of fidelity test results. FIG. 19 compares the real cost of synthesized circuits with the predicted cost of few designs, which have been selected randomly from 8-, 10-, 12-bit resolution design space of all functions of Table V. As can be seen, the predicted cost follows the synthesized cost well. Therefore, the proposed model can provide configuration parameters that lead to an optimal or near-optimal solution.

Figure 20:
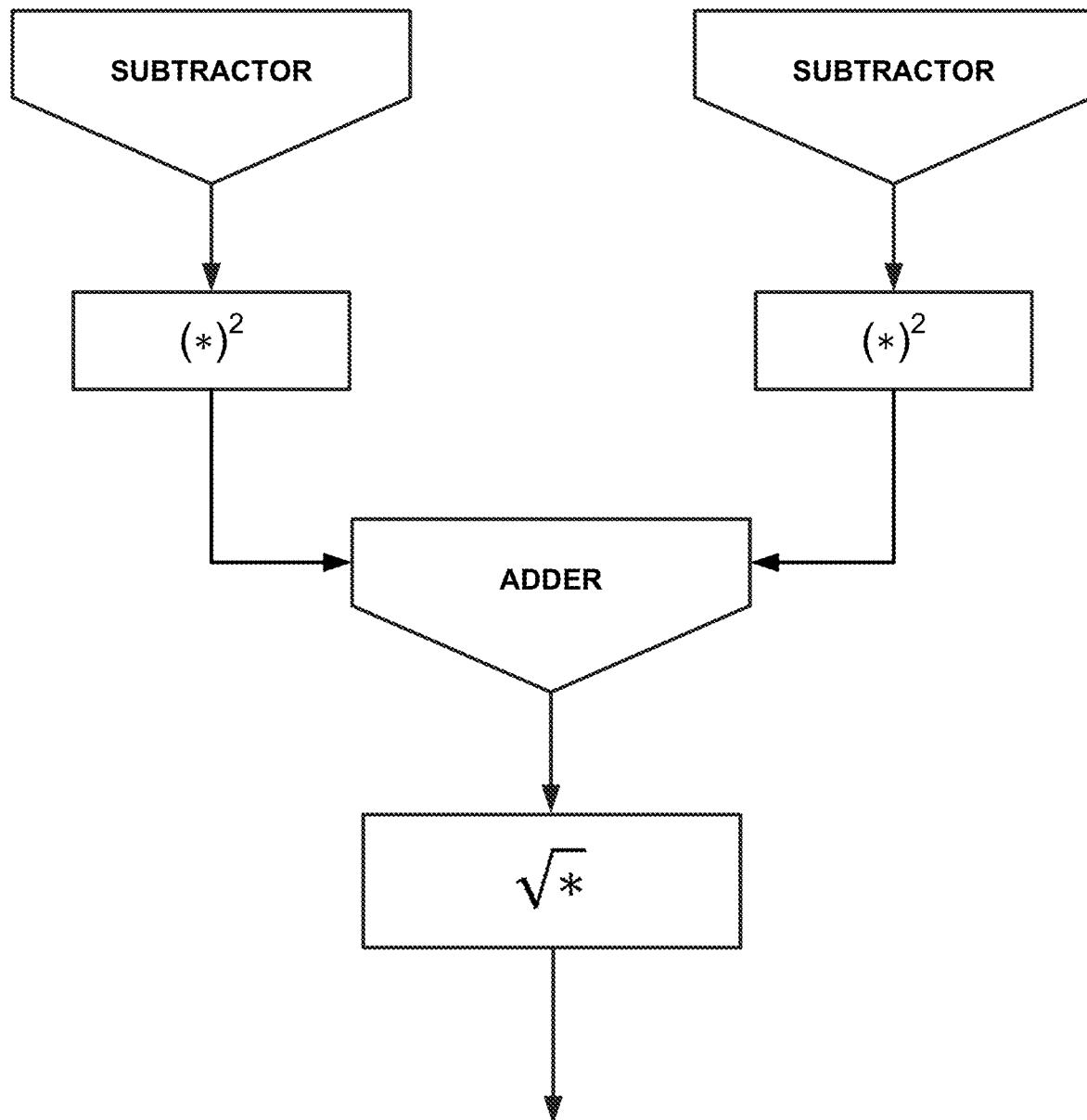
FIG. 20 is a conceptual block diagram of a Robert cross edge detection architecture.

FIG. 20 is a conceptual block diagram of a Robert cross edge detection architecture. The hybrid binary-unary method can be evaluated using the Robert cross edge detection algorithm shown in FIG. 20 at 8-bit resolution. In the conventional binary implementation, a CORDIC unit can evaluate the square root function. The fully unary and hybrid binary-unary versions of the square and square root functions can be used to evaluate these methods. Table X shows the hardware implementation results. The hybrid binary-unary method has 7% and 37.6% the cost of the binary and the fully-unary implementations, respectively.

TABLE X

Robert cross hardware results.

| Method | LUT | FF | D(ns) | Cy | A × D | Ratio |
|---|---|---|---|---|---|---|
| Conventional Binary | 243 | 40 | 14.812 | 1 | 3.6k | 1 |
| Fully Unary | 252 | 80 | 2.67 | 1 | 672 | 0.186 |
| Hybrid Binary-Unary | 107 | 80 | 2.37 | 1 | 253 | 0.070 |

Figure 21B:
FIGS. 21A and 21B shows an original image and an output of a hybrid binary-unary architecture.
Figure 21A:

FIGS. 21A and 21B shows an original image and an output of a hybrid binary-unary architecture. The error of the hardware output is 0.0% compared to the MATLAB simulation.

The hybrid binary-unary computing approach to implement complex functions may have lower cost than the fully unary, the stochastic computing, and conventional binary approaches. The hybrid binary-unary architecture takes advantage of the compact representation of the binary method and simple implantation of the fully unary method to design a hybrid architecture. A synthesizer can create a design space as well as a model to predict an optimal or sub-optimal design. The hybrid binary-unary method solidly outperforms other methods at 8- and 10-bit resolutions. Moreover, the hybrid binary-unary method was competitive with the conventional binary and fully unary method on an edge detection algorithm.

Figure 22:
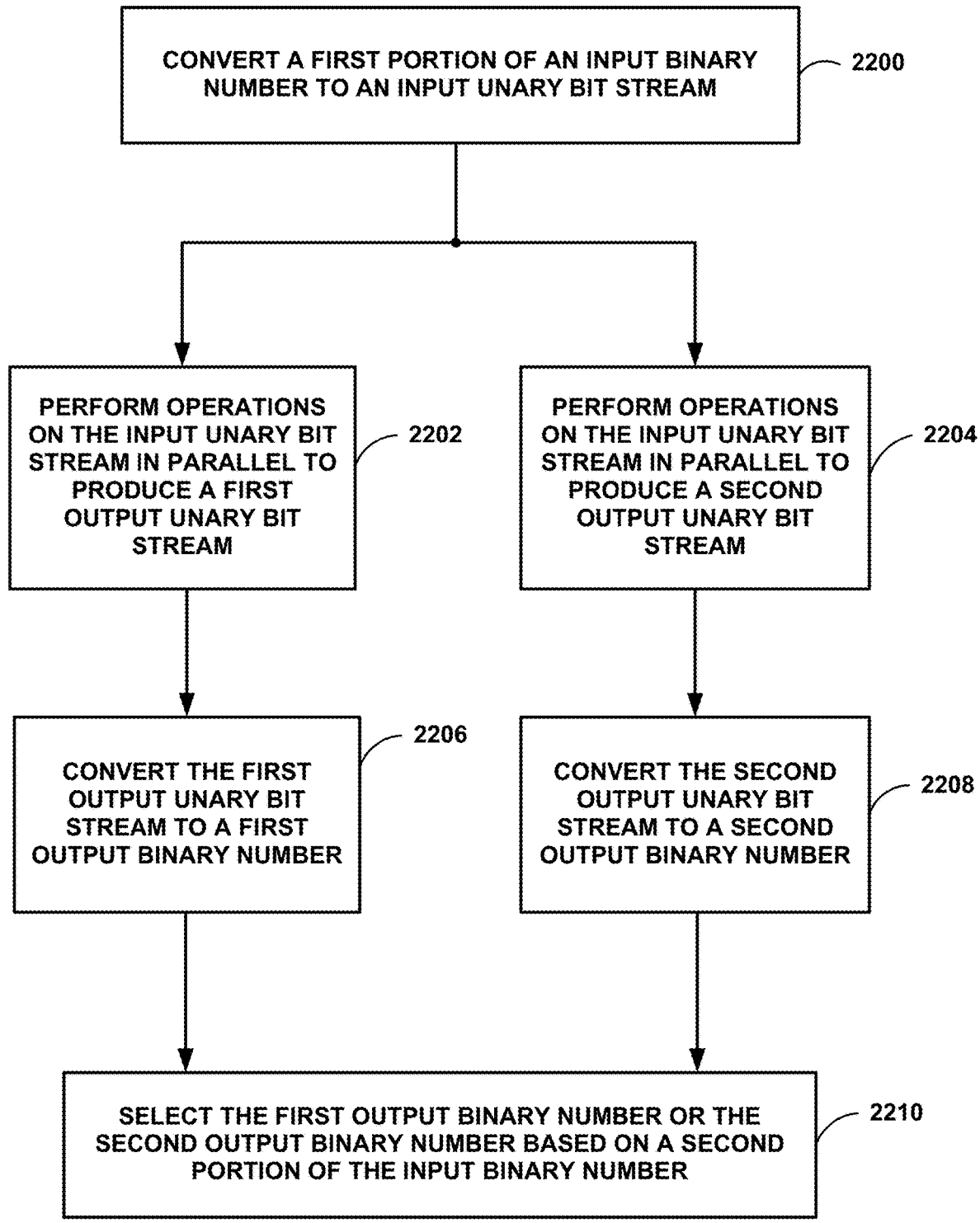
FIG. 22 is a flowchart illustrating example techniques for performing operations on binary numbers using a hybrid binary-unary method, in some examples of this disclosure.

FIG. 22 is a flowchart illustrating example techniques for performing operations on binary numbers using a hybrid binary-unary method, in some examples of this disclosure. The techniques of FIG. 22 are described with reference to the circuitry of FIG. 12, although other components may perform similar techniques.

In the example of FIG. 22, thermometer encoders 1210 convert a first portion of an input binary number to an input unary bit stream (2200). Thermometer encoders 1210 can receive the lower M bits of the N-bit binary number stored in register 1200. The area of thermometer encoders 1210 can be substantially less for converting M bits, as compared to a thermometer encoder for converting N bits. The lower M bits may be any number of bits, including one, two, three, or more bits.

In the example of FIG. 22, unary cores 1230 performs operations on the input unary bit stream to produce at least two output unary bit streams (2202, 2204). The operations can include computational operations, such as multiplication, addition, and scaled addition. Unary cores 1230 may include logic gates, stochastic logic circuitry, lookup tables, and/or any other computational circuitry.

In the example of FIG. 22, decoders 1240 convert each of the at least two output unary bit streams to a respective output binary number (2206, 2208). The output binary numbers can have the same resolution as the input to thermometer encoders 1210 (e.g., M bits).

In the example of FIG. 22, multiplexer 1250 selects the first or second output binary number based on a second portion of the input binary number (2210). Multiplexer 1250 can receive the upper N-M bits of the binary number stored in register 1200 and use the upper N-M bits as the control input for multiplexer 1250. In examples in which N-M equals two bits, multiplexer 1250 can select from four inputs. The upper M bits may be any number of bits, including one, two, three, or more bits. The four inputs to multiplexer 1250 may represent four sub-functions, which can be combined to approximate a function, as shown in FIGS. 13-16. FIGS. 15 and 16 show an example with five sub-function, where each of the first two sub-functions have an input range of 32, and each of the next three sub-functions have an input range of 64.

This disclosure contemplates computer-readable storage media comprising instructions to cause a processor to perform any of the functions and techniques described herein. The computer-readable storage media may take the example form of any volatile, non-volatile, magnetic, optical, or electrical media, such as random-access memory (RAM), read-only memory (ROM), nonvolatile RAM (NVRAM), electrically erasable programmable ROM (EEPROM), or flash memory. The computer-readable storage media may be referred to as non-transitory. A computing device may also contain a more portable removable memory type to enable easy data transfer or offline data analysis.

The techniques described in this disclosure, including those attributed to device 100, and various constituent components, may be implemented, at least in part, in hardware, software, firmware or any combination thereof. For example, various aspects of the techniques may be implemented within one or more processors, including one or more microprocessors, digital signal processors (DSPs), application-specific integrated circuits (ASICs), field-programmable gate arrays (FPGAs), or any other equivalent integrated or discrete logic circuitry, as well as any combinations of such components, embodied in programmers, remote servers, or other devices. The term "processor" or "processing circuitry" may generally refer to any of the foregoing logic circuitry, alone or in combination with other logic circuitry, or any other equivalent circuitry.

Such hardware, software, firmware may be implemented within the same device or within separate devices to support the various operations and functions described in this disclosure. For example, any of the techniques or processes described herein may be performed within one device or at least partially distributed amongst two or more devices, such as between the components of device 100. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in an article of manufacture including a non-transitory computer-readable storage medium encoded with instructions. Instructions embedded or encoded in an article of manufacture including a non-transitory computer-readable storage medium encoded, may cause one or more programmable processors, or other processors, to implement one or more of the techniques described herein, such as when instructions included or encoded in the non-transitory computer-readable storage medium are executed by the one or more processors. Example non-transitory computer-readable storage media may include RAM, ROM, PROM, EPROM, EEPROM, flash memory, a hard disk, a compact disc ROM (CD-ROM), a floppy disk, a cassette, magnetic media, optical media, or any other computer readable storage devices or tangible computer readable media.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache). Elements of device 100 may be programmed with various forms of software. The one or more processors may be implemented at least in part as, or include, one or more executable applications, application modules, libraries, classes, methods, objects, routines, subroutines, firmware, and/or embedded code, for example.

Various embodiments of the invention have been described. These and other embodiments are within the scope of the following claims.

The invention claimed is:

1. A device comprising:
shuffling circuitry configured to receive an input unary bit stream and generate a shuffled bit stream by selecting n-tuple combinations of bits of the input unary bit stream, wherein the input unary bit stream comprises a deterministic bit stream that deterministically encodes a numerical value based on a proportion of data bits in the deterministic bit stream that are high relative to a total number of data bits in the deterministic bit stream; and
stochastic logic circuitry having a plurality of stochastic computational circuits configured to perform operations on the shuffled bit stream in parallel by operating on the deterministic bit stream to produce an output unary bit stream, each of the stochastic computational circuits operating on a different one of the n-tuple combinations of the bits.

2. The device of claim 1, wherein the shuffling circuitry is configured to operate according to a sweeping pattern defined with respect to a matrix of bits to select the n-tuple combinations of bits, wherein each dimension of the matrix corresponds to bit positions of the input unary bit stream, and wherein the shuffling circuitry is configured to select the n-tuple combinations to draw exactly one combination per each layer of the matrix.

3. The device of claim 2, wherein the shuffling circuitry is configured to select the n-tuple combinations of bits by selecting a subset of unique n-tuple combinations of bits of the input unary bit stream.

4. The device of claim 1, further comprising:
encoder circuitry configured to convert a first portion of an input binary number to the input unary bit stream, wherein the shuffling circuitry is configured to generate, from the input unary bit stream, at least two shuffled bit streams, and
wherein the stochastic logic circuitry is configured to perform operations on the at least two shuffled bit streams to produce at least two output unary bit streams;
decoder circuitry configured to convert the at least two output unary bit streams to at least two output binary numbers; and
a first multiplexer configured to select one output binary number of the at least two output binary numbers based on a second portion of the input binary number.

5. The device of claim 4, further comprising:
a second multiplexer configured to select an offset value based on the second portion of the input binary number; and
an adder configured to add the selected output binary number to the selected offset value.

6. The device of claim 4, wherein each of the at least two output unary bit streams represents a result of a different computational operation.

7. The device of claim 4,
wherein the first portion of the input binary number comprises M least significant bits of the input binary number, and
wherein the second portion of the input binary number comprises (N minus M) most significant bits of the input binary number.

8. The device of claim 1, further comprising decoding circuitry configured to:
receive the output unary bit stream; and
convert the output unary bit stream to an output binary number or an analog output voltage.

9. The device of claim 1, wherein the plurality of stochastic computational circuits comprises one or more of an AND logic gate, a MUX logic gate, an OR logic gate, an XOR logic gate, a NOR logic gate, a NAND logic gate, a XNOR logic gate, an INV logic gate, or a lookup table.

10. The device of claim 1, wherein the device comprises one or more of a sensor, a field-programmable gate array, an application-specific integrated circuit, or an embedded system.

11. The device of claim 1, wherein the n-tuple combinations of bits comprises a subset of unique pair-wise combinations of bits of the input unary bit stream.

12. The device of claim 1, further comprising edge-coding circuitry configured to convert the input unary bit stream to an edge-coded bit stream, and wherein the shuffling circuitry is configured to generate the shuffled bit stream based on the edge-coded bit stream.

13. A method comprising:
receiving, with an electronic device, an input unary bit stream, wherein the input unary bit stream comprises a deterministic bit stream that deterministically encodes a numerical value based on a proportion of data bits in the deterministic bit stream that are high relative to a total number of data bits in the deterministic bit stream;

generating, from the input unary bit stream, a shuffled bit stream by selecting n-tuple combinations of bits of the input unary bit stream; and processing the n-tuple combinations of bits in parallel with a plurality of stochastic computational circuits by operating on the deterministic bit stream to produce an output unary bit stream, each of the stochastic computational circuits operating on a different one of the n-tuple combinations of the bits.

14. The method of claim 13, wherein generating the shuffled bit stream comprises operating according to a layered sweeping pattern defined with respect to a matrix of bits to select the n-tuple combinations of bits, wherein each dimension of the matrix corresponds to bit positions of the input unary bit stream, and wherein the n-tuple combinations is selected to draw exactly one combination per each dimension of the matrix.

15. The method of claim 13, wherein selecting the n-tuple combinations of bits comprises selecting a subset of unique n-tuple combinations of bits of the input unary bit stream.

16. The method of claim 13, further comprising:

converting a first portion of an input binary number to the input unary bit stream;

generating, from the input unary bit stream, at least two shuffled bit streams based on the input unary bit stream;

processing the at least two shuffled bit streams to produce at least two output unary bit streams;

converting the at least two output unary bit streams to at least two output binary numbers; and selecting one output binary number of the at least two output binary numbers based on a second portion of the input binary number.

17. The method of claim 16, further comprising:

selecting an offset value based on the second portion of the input binary number; and adding the selected output binary number to the selected offset value.

18. A method comprising:

assembling stochastic logic circuitry having a plurality of stochastic computational circuits configured to perform operations on an input bit stream in parallel to produce an output bit stream, wherein each of the stochastic computational circuits is configured to operate on a different one of n-tuple combinations of the bits selected from the input stream, wherein the stochastic computational circuits are configured to perform operations on the input bit stream to produce the output bit stream by approximating a mathematical function, and wherein assembling the stochastic logic circuitry is based on selection methodology by selecting a subset of a plurality of Bernstein basis functions and synthesizing the stochastic computational circuits using global optimization or genetic algorithms to fit the mathematical function.

19. A device comprising:

encoder circuitry configured to convert a first portion of an input binary number to an input unary bit stream;

shuffling circuitry configured to receive the input unary bit stream and generate at least two shuffled bit streams by selecting n-tuple combinations of bits of the input unary bit stream;

stochastic logic circuitry having a plurality of stochastic computational circuits configured to perform operations on the at least two shuffled bit streams in parallel to produce at least two output unary bit streams, each of the stochastic computational circuits operating on a different one of the n-tuple combinations of the bits;

decoder circuitry configured to convert the at least two output unary bit streams to at least two output binary numbers; and a first multiplexer configured to select one output binary number of the at least two output binary numbers based on a second portion of the input binary number.

20. The device of claim 19, further comprising:

a second multiplexer configured to select an offset value based on the second portion of the input binary number; and an adder configured to add the selected output binary number to the selected offset value.

* * * * *